US009685436B2

(12) United States Patent
Morrow et al.

(10) Patent No.: US 9,685,436 B2
(45) Date of Patent: Jun. 20, 2017

(54) MONOLITHIC THREE-DIMENSIONAL (3D) ICS WITH LOCAL INTER-LEVEL INTERCONNECTS

(71) Applicant: Intel Corporation, Santa Clara, CA (US)

(72) Inventors: Patrick Morrow, Portland, OR (US); Kimin Jun, Hillsboro, OR (US); M. Clair Webb, North Logan, UT (US); Donald W. Nelson, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/778,512

(22) PCT Filed: Jun. 25, 2013

(86) PCT No.: PCT/US2013/047542
§ 371 (c)(1),
(2) Date: Sep. 18, 2015

(87) PCT Pub. No.: WO2014/209278
PCT Pub. Date: Dec. 31, 2014

(65) Prior Publication Data
US 2016/0197069 A1 Jul. 7, 2016

(51) Int. Cl.
*H01L 27/088* (2006.01)
*H01L 21/84* (2006.01)
(Continued)

(52) U.S. Cl.
CPC .... *H01L 27/0688* (2013.01); *H01L 21/76895* (2013.01); *H01L 21/76897* (2013.01);
(Continued)

(58) Field of Classification Search
CPC .......... H01L 27/0688; H01L 21/76895; H01L 21/76897
(Continued)

(56) References Cited

U.S. PATENT DOCUMENTS

2001/0028059 A1   10/2001   Emma et al.
2004/0243419 A1   12/2004   Wang
(Continued)

FOREIGN PATENT DOCUMENTS

| JP | 2005203780 A | 7/2005 |
| JP | 2007250863 A | 9/2007 |
| KR | 1020100088270 A | 9/2010 |
| TW | 200513884 | 4/2005 |
| TW | 200527657 | 8/2005 |

OTHER PUBLICATIONS

English Translation of JP,2007-250863,A (Mori et al.; Seiko Epson Corp) Sep. 27, 2007.*
(Continued)

*Primary Examiner* — Long K Tran
(74) *Attorney, Agent, or Firm* — Green, Howard & Mughal LLP

(57) ABSTRACT

Monolithic 3D ICs employing one or more local inter-level interconnect integrated intimately with at least one structure of at least one transistor on at least one transistor level within the 3D IC. In certain embodiments the local inter-level interconnect intersects a gate electrode or a source/drain region of at least one transistor and extends through at least one inter-level dielectric layer disposed between a first and second transistor level in the 3D IC. Local inter-level interconnects may advantageously make a direct vertical connection between transistors in different levels of the 3D IC without being routed laterally around the footprint (i.e., lateral, or planar, area) of either the overlying or underlying transistor level that is interconnected.

24 Claims, 17 Drawing Sheets

(51) Int. Cl.
| | |
|---|---|
| *H01L 27/06* | (2006.01) |
| *H01L 27/11* | (2006.01) |
| *H01L 21/8234* | (2006.01) |
| *H01L 27/12* | (2006.01) |
| *H01L 21/768* | (2006.01) |
| *H01L 21/822* | (2006.01) |
| *H01L 23/538* | (2006.01) |
| *H01L 29/78* | (2006.01) |

(52) U.S. Cl.
CPC .. *H01L 21/8221* (2013.01); *H01L 21/823431* (2013.01); *H01L 21/845* (2013.01); *H01L 23/5386* (2013.01); *H01L 27/0886* (2013.01); *H01L 27/1104* (2013.01); *H01L 27/1116* (2013.01); *H01L 27/1211* (2013.01); *H01L 29/785* (2013.01); *H01L 2924/0002* (2013.01)

(58) Field of Classification Search
USPC .................................. 257/393, 401; 438/152
See application file for complete search history.

(56) References Cited

U.S. PATENT DOCUMENTS

| | | |
|---|---|---|
| 2005/0151276 A1 | 7/2005 | Jang et al. |
| 2006/0220134 A1 | 10/2006 | Huo et al. |
| 2010/0195375 A1 | 8/2010 | Park et al. |
| 2015/0311142 A1* | 10/2015 | Sekar .................. H01L 23/3677 257/499 |

OTHER PUBLICATIONS

International Search Report and Written Opinion mailed Mar. 31, 2014, for PCT Application No. PCT/US2013/047542.
International Preliminary Report on Patentability mailed Jan. 7, 2016, for International Application No. PCT/US2013/047542.
Office Action and Search Report for Taiwan Patent Application No. 103118804, issued on May 2, 2016, translation provided.

* cited by examiner

MONOLITHIC THREE-DIMENSIONAL (3D) ICS WITH LOCAL INTER-LEVEL INTERCONNECTS

CLAIM FOR PRIORITY

The present application claims the benefit of priority of International Patent Application PCT/US2013/047542, filed on 25 Jun. 2013, and titled "MONOLITHIC THREE-DIMENSIONAL (3D) ICS WITH LOCAL INTER-LEVEL INTERCONNECTS", the contents of which are hereby incorporated in their entirety for all purposes.

TECHNICAL FIELD

Embodiments of the invention generally relate to integrated circuits (ICs), and more particularly pertain to monolithic three-dimensional (3D) ICs.

BACKGROUND

Monolithic ICs generally comprise a number of transistors, such as metal-oxide-semiconductor field-effect transistors (MOSFETs) fabricated over a planar substrate, such as a silicon wafer. While Moore's Law has held true for decades within the IC industry, lateral scaling of IC dimensions is becoming more difficult with MOSFET gate dimensions now below 20 nm. As device sizes continue to decrease, there will come a point where it becomes impractical to continue standard planar scaling. This inflection point could be due to economics or physics, such as prohibitively high capacitance, or quantum-based variability. Stacking of transistors in a third dimension, typically referred to as vertical scaling, or 3D integration, is therefore a promising path toward greater transistor density.

While 3D integration may be achieved at a package level, for example by stacking separately manufactured chips, a monolithic 3D approach offers the greatest inter layer interconnect density, allowing 3D circuits to be constructed at the lowest level and the tightest circuit density. Generally, monolithic 3D ICs entail two or more levels of transistors that are sequentially fabricated and interconnected over a substrate. For example, beginning with a first semiconductor substrate, a first level of transistors is fabricated with conventional techniques. A donor substrate is then bonded to the first substrate and a portion of the donor substrate is cleaved off to leave a semiconductor thin film over the first level of transistors. This method is of course only one of many ways to obtain a single crystal substrate for the second layer of devices. A second level of transistors is then fabricated in the semiconductor thin film and inter-level interconnects formed between the transistor levels. Although greater alignment between transistor levels is possible with monolithic 3D ICs, the architecture of the inter-level interconnect is important in achieving a good economy of scale where the planar footprint of the monolithic 3D IC decreases proportionally with the number of transistor levels.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
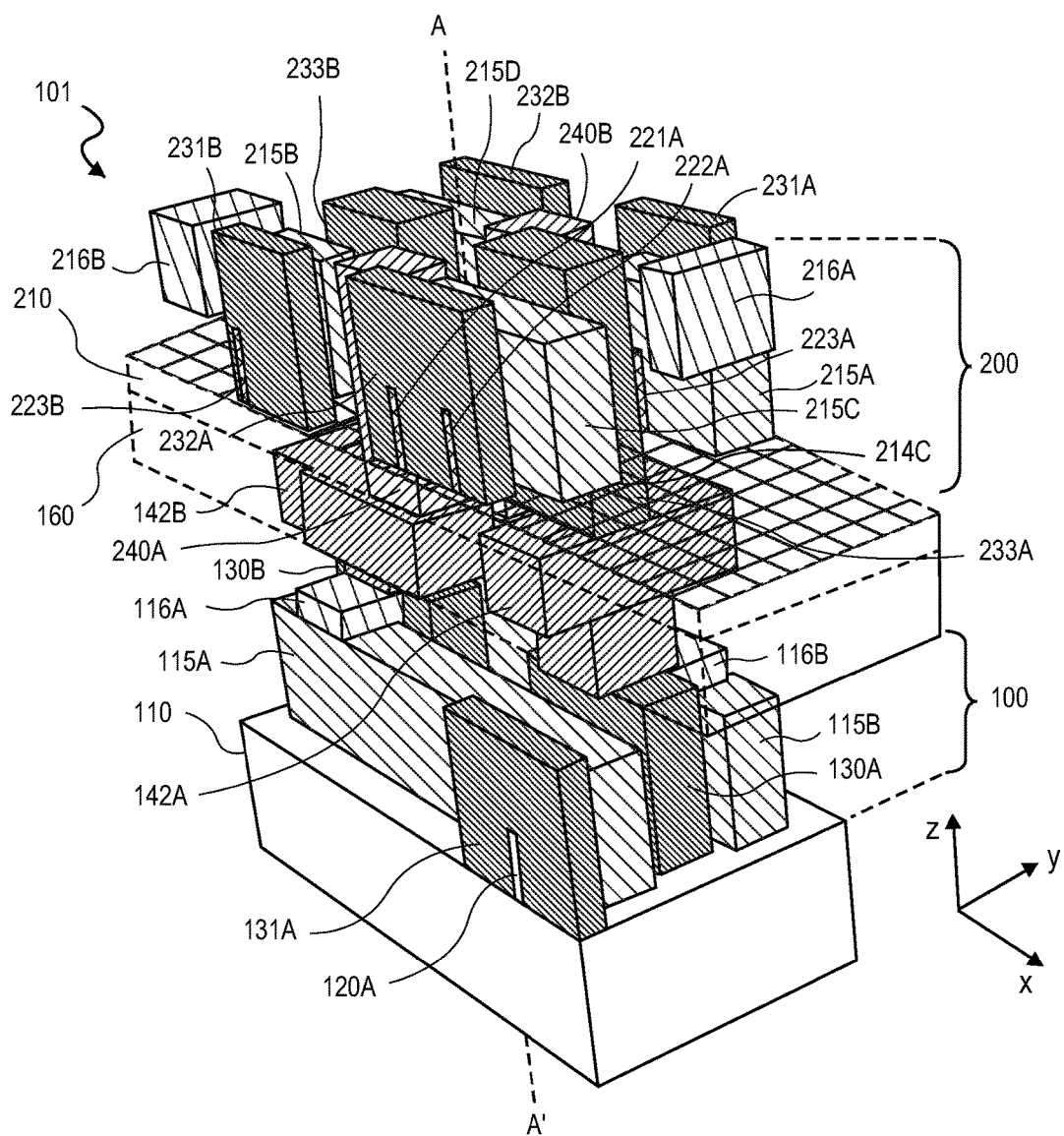
FIG. 1A is an isometric view of a monolithic 3D IC with local inter-level interconnects, in accordance with an embodiment.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings and are not intended to restrict the application of claimed subject matter. Therefore, the following detailed description is not to be taken in a limiting sense and the scope of claimed subject matter is defined solely by the appended claims and their equivalents.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

As will be described in greater detail below, monolithic 3D ICs in accordance with embodiments employ one or more local inter-level interconnects. A "local" inter-level interconnect is integrated intimately with at least one structure of at least one transistor on at least one transistor level within the 3D IC. For example, in certain embodiments the local inter-level interconnect intersects a gate electrode or a source/drain region of at least one transistor. A local "inter-level" interconnect extends through at least one inter-level dielectric layer disposed between a first (e.g., lower) and second (e.g., upper) transistor level in the monolithic 3D IC. The local inter-level interconnect embodiments described herein may advantageously make a direct vertical connection between transistors in different levels of the monolithic 3D IC without being routed laterally around the footprint (i.e., lateral, or planar, area) of either the overlying or underlying transistor level that is interconnected. The local inter-level interconnects described herein may reduce the footprint of a monolithic 3D IC. In certain embodiments, the local inter-level interconnect is multi-functional, for example serving a function native to one or more transistor as well as electrically interconnecting two or more transistors. For example, in an embodiment a local inter-level interconnect serves as a contact to a semiconductor source/drain (i.e., diffusion) region of a transistor on one transistor level and further serves to interconnect that source/drain region to a terminal of another transistor on another transistor level. In this manner, the substrate area and fabrication complexity may not be substantially more than for a comparably dimensioned single-transistor-level IC.

As will also be described in greater detail below, in certain embodiments formation of a monolithic 3D IC may include receiving a first transistor disposed over a substrate, disposing a second transistor over the first transistor with one or more inter-level dielectric layers disposed there between. An inter-level via is then formed that intersects a gate electrode or a semiconductor source/drain region of the second transistor, extends through at least one of the one or more inter-level dielectric layers, and exposes a conductive via land that is electrically coupled to the first transistor. The inter-level via is then filled with metal that contacts both the via land and a gate electrode, or source/drain region, to form the local inter-level interconnect.

Figure 1B:
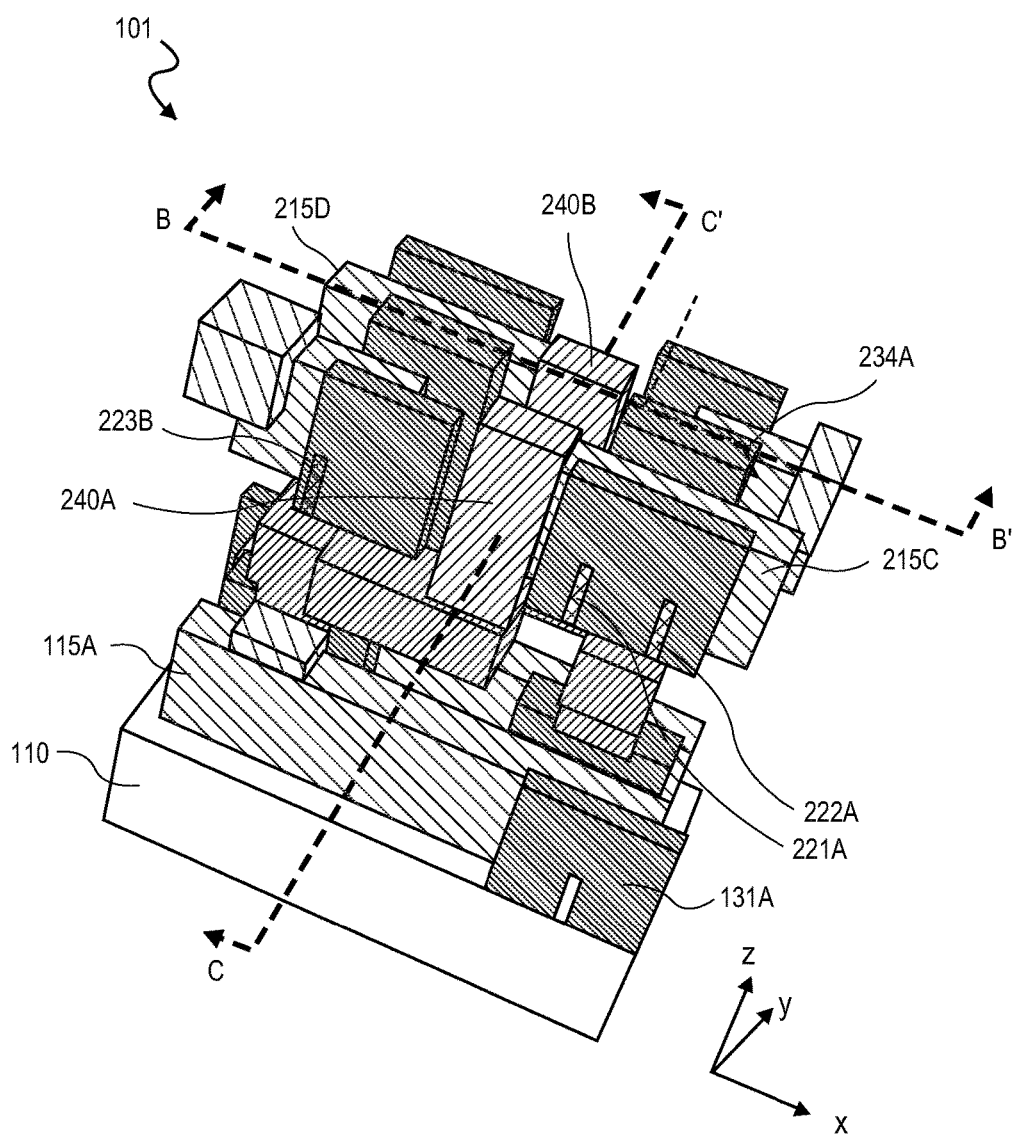
FIG. 1B is a second isometric view of the monolithic 3D IC depicted in FIG. 1A, in accordance with an embodiment.

FIG. 1A. is an isometric view of monolithic 3D IC 101 with local inter-level interconnects, in accordance with an embodiment of the present invention. FIG. 1B. is a second isometric view of monolithic 3D IC 101. Relative to FIG. 1A, monolithic 3D IC 101 is rotated in FIG. 1B about the A-A' line extending along the vertical (z) dimension shown in FIG. 1A, as well as about a line parallel the B-B' line extending laterally along a first horizontal (x) dimension, and about a line parallel the C-C' line extending laterally along a second horizontal (y) dimension. Monolithic 3D IC 101 is disposed on substrate 110, which may be any substrate known in the art to be suitable for forming an IC, such as, but not limited to, a semiconductor substrate, semiconductor-on-insulator (SOI) substrate, or an insulator substrate (e.g., sapphire), the like, and/or combinations thereof. In one exemplary embodiment, substrate 110 comprises a substantially monocrystalline semiconductor, such as, but not limited to, silicon. Disposed over substrate 110 is transistor level 100, and disposed over transistor level 100 is transistor level 200. In embodiments, a transistor level includes at least one semiconductor body, which is advantageously substantially monocrystalline, although polycrystalline embodiments are also possible.

As shown in FIGS. 1A and 1B, transistor level 100 includes semiconductor body 120A extending laterally over an area of substrate 110. A laterally oriented transistor generally entails a semiconductor channel region occupying a first area of a substrate while semiconductor source/drain regions occupy a second area of the substrate (in contrast to a vertical orientation where a channel region occupies the same substrate area as the source/drain regions). Although not visible in FIG. 1A or 1B, because 3D IC 101 has a 180° rotational symmetry about the A-A' line, a second semiconductor body substantially identical semiconductor body 120A also extends laterally on transistor level 100 (i.e., co-planar with semiconductor body 120A). Second transistor level 200 includes semiconductor bodies 221A, 222A, and 223B, each of which is advantageously substantially monocrystalline, although polycrystalline embodiments are also possible. Although not all visible in FIG. 1A or 1B, because 3D IC 101 has a 180° rotational symmetry about the A-A' line, three additional semiconductor bodies substantially identical semiconductor bodies 221A, 222A, and 223B (one being semiconductor body 223A) also extend laterally within transistor level 200 (i.e., co-planar with semiconductor bodies 221A, 222A, and 223B). Notably, in this exemplary embodiment all of the semiconductor bodies in both transistor levels 100, 200 are fins. While a "finFET" architecture represents the current state of the art in manufacturable transistor technology, alternate embodiments are also possible where one or more of the semiconductor bodies for one or more of the transistor levels in a 3D IC is planar, or has any other non-planar structure known in the art, such as a nanoribbon, nanowire, etc. Furthermore, one transistor level may have semiconductor bodies of a first type (e.g., fins), while another transistor level may have semiconductor bodies of a second type (e.g., planar).

Within transistor level 100, is a pair of source/drain metallizations 130A, 131A disposed over doped (e.g., n-type or p-type) source/drain regions of semiconductor body 120A. Between the pair of source/drain metallizations 130A, 131A, is a gate electrode 115A having a width extending in the x-dimension and a length extending in the y-dimension. Gate electrode 115A is disposed over a channel region of semiconductor body 120A with a gate dielectric layer (not depicted) disposed between gate electrode 115A and semiconductor body 120A to form a gate stack capable of modulating conductivity between source/drain metallizations 130A, 131A by way of the field effect within the channel region. Another gate electrode 115B similarly extends over a second first-level transistor (not depicted) modulating channel conductivity between source/drain metallization 130B and a corresponding second source/drain metallization (not depicted) on an opposite side of gate electrode 115B. Gate electrodes 115A, 115B are each contacted by gate electrode metallization 116A, 116B.

Within second transistor level 200, there are similar pairs of source/drain metallizations 232A, 233A for semiconductor bodies 221A, 222A and pairs of source/drain metallizations 231B, 233B for semiconductor body 223B. A second pair of source/drain metallizations 231A, 233A is further coupled to source/drain regions of semiconductor body 223A, with a second pair of source/drain metallizations 232B, 233B coupled to source/drain regions of two semiconductor bodies substantially identical to semiconductor bodies 221A and 222A. Four gate electrodes 215A, 215B, 215C, and 215D control channel regions of the second-level transistors. Disposed on gate electrodes 215A and 215B are gate electrode contact metallizations 216A and 216B, respectively, which provide an interface between the gate electrodes and a second-level interconnect metallization (not depicted), functional, for example, as a word line of an SRAM bit cell. The various source/drain metallizations, gate electrodes, gate electrode metallization, and gate dielectrics may each be of any conventional composition. For exemplary embodiments having silicon semiconductor bodies in both transistor levels 100, 200, the source/drain metallizations may include one or more ohmic metal (e.g., a silicide) and one or more a bulk metal. Similarly, the gate electrodes may include one or more of: polysilicon; a work function metal; and/or one or more bulk metal. The gate dielectrics may for example include any conventional material (e.g., silicon dioxide, silicon oxynitride, etc.) or high-K material (e.g., having a bulk dielectric constant of at least 10) known in the art.

Between transistor levels is one or more inter-level dielectric layer. In the illustrative embodiment shown in FIGS. 1A, 1B, inter-level dielectric layer 210 is disposed in contact with intra-level dielectric layer 160, both of which are drawn in dashed line so as to not obscure other features of 3D IC 101. One more intra-level dielectric layer may be disposed under intra-level dielectric layer 160 to isolate various conductive regions of transistor level 100, and one or more intra-level dielectric layer may be similarly disposed over inter-level dielectric layer 210 to isolate various conductive regions of transistor level 200. For the sake of clarity, the various intra-level dielectrics are not delineated in FIGS. 1A, 1B. Inter-level dielectric layer 210 is in direct contact with a least a portion of semiconductor bodies 221A, 222A, and 223B. The interface between top inter-level dielectric layer 210 and intra-level dielectric layer 160, may for example, result from bonding a donor substrate to substrate 110. The composition of dielectric layers 160, 210 may be the same or differ from each other with any dielectric composition known in the art being generally permissible. Exemplary materials include silicon dioxide, silicon nitride, silicon-oxy-nitride, carbon-doped silicon dioxide (CDO), or another low-k material.

In accordance with embodiments, transistors of at least two different levels are coupled by local inter-level interconnects intersecting either a gate electrode or a source/drain region of a transistor in at least one level, and extending vertically (e.g., substantially orthogonally to the laterally-oriented transistors) through at least one inter-level dielectric layer between an upper and a lower transistor level. For example, as further illustrated in FIGS. 1A and 1B, 3D IC 101 includes two pairs of local inter-level interconnects: the two source/drain metallizations 233A and 233B, which intersect source/drain regions of semiconductor bodies 221A, 222A and 231B, respectively; and the two gate electrode interconnects 240A and 240B, which intersect gate electrodes 215C, and 215D, respectively. As shown, each of these local inter-level interconnects extends along the z-dimension through inter-level dielectric layer 210 to make electrical contact to one or more terminal of a first-level transistor.

Figure 1C:
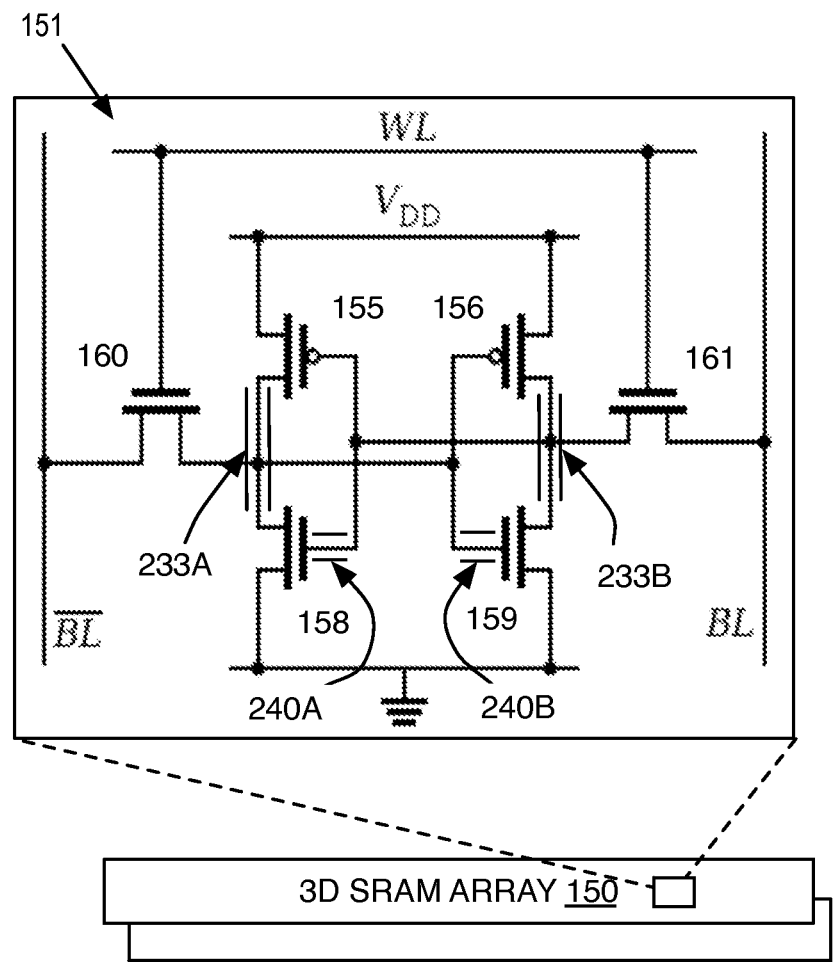
FIG. 1C is an SRAM cell circuit mapped to the inter-level interconnects depicted in FIGS. 1A and 1B, in accordance with an embodiment.

In one exemplary embodiment, a monolithic 3D SRAM cell employs local inter-level interconnects. FIG. 1C. illustrates a 3D SRAM array 150 which includes a plurality of such SRAM bit cells. The expanded view 151 depicts a circuit schematic of a 3D SRAM cell mapped to the transistors and local inter-level interconnects depicted in FIGS. 1A and 1B. In an embodiment where memory array 150 employs a six-transistor (6T) SRAM cell, each bit cell includes six transistors arranged as shown in FIG. 1C. In one such embodiment, two p-channel load transistors 155, 156 are disposed in transistor level 100 (FIGS. 1A, 1B), while four n-channel transistors, including two drive transistors 158, 159 (FIG. 1C) and two pass-gate transistors 160, 161, are disposed in transistor level 200 (FIGS. 1A, 1B). Drive transistors 158, 159 each include two semiconductor bodies (e.g., 221A, 222A) with three terminals coupled together in electrical parallel for increased drive current/beta. The drive and load transistors form two cross-coupled inverters, where the output of one inverter is the input to the other inverter. Two pass-gate transistors 160, 161 are gated, or coupled, by a word line (WL) and each pass-gate transistor couples the output of one of the inverters to a bit line (BL). As illustrated in FIG. 1C, the gates of drive transistors 158, 159 are coupled to gates of load transistors 155, 156 by inter-level gate electrode interconnects 240A, 240B, respectively, while drains of drive transistors 158, 159 are coupled to drains of load transistors 155, 156 by source/drain metallizations 233A, 233B. The use of local inter-level interconnects within monolithic 3D SRAM cell 151 enables a significant reduction in the footprint of the 6T bit cell. A similar footprint reduction can be expected for other cells, such as XOR, INV, etc.

Figure 2A:
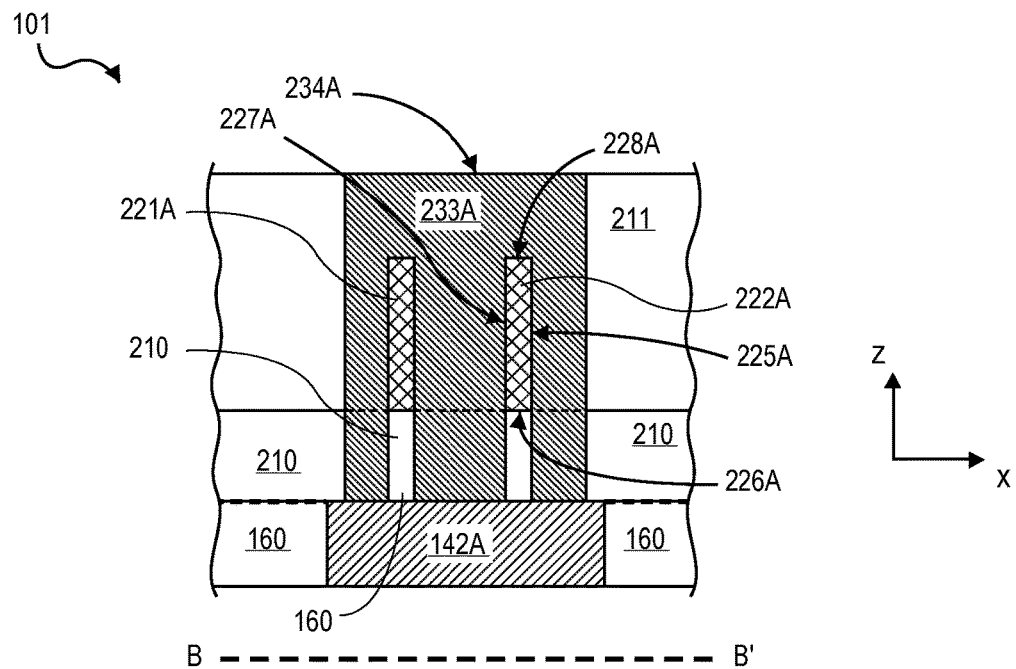
FIG. 2A is a cross-sectional view of an inter-level source/drain interconnect in the monolithic 3D IC depicted in FIG. 1A, in accordance with an embodiment.

The two pairs of local inter-level interconnects depicted in FIGS. 1A and 1B are now discussed in turn, beginning with FIG. 2A, which is a cross-sectional view of an inter-level source/drain interconnect taken along a plane including the B-B' line in FIG. 1B, in accordance with an embodiment. Generally, an inter-level source/drain interconnect intersects a source/drain semiconductor region of a transistor in a transistor level (e.g., upper level). In the exemplary embodiment depicted in FIG. 2A where semiconductor bodies 221A, 222A are fins, source/drain metallization 233A contacts at least one semiconductor fin sidewall 225A, 227A, and may advantageously contact both opposing source/drain semiconductor sidewalls 225A, 227A, as well as source/drain semiconductor top surface 228A. In the depicted embodiment, source/drain metallization 233A extends past (below) source/drain semiconductor bottom surface 226A and through inter-level dielectric layer 210 to contact a portion of intra-level interconnect metallization 142A in lateral alignment with source/drain metallization 233A. As shown in FIG. 2A, remnants of inter-level dielectric layer 210 may be disposed under source/drain semiconductor bottom surface 226A, for example as masked by a semiconductor body. In alternate embodiments, for example where semiconductor bodies 221A, 222A are nanoribbons or nanowires, source/drain metallization 233A may additionally contact source/drain semiconductor bottom surface 226A to wrap completely around the depicted transverse cross section of the source/drain region. For embodiments with a planar semiconductor body, a top surface analogous to 228A in FIG. 2A serves as the primary surface of contact except where the contact metallization is embedded into the source drain region, in which event there may be sidewall contact surface as well.

Figure 2B:
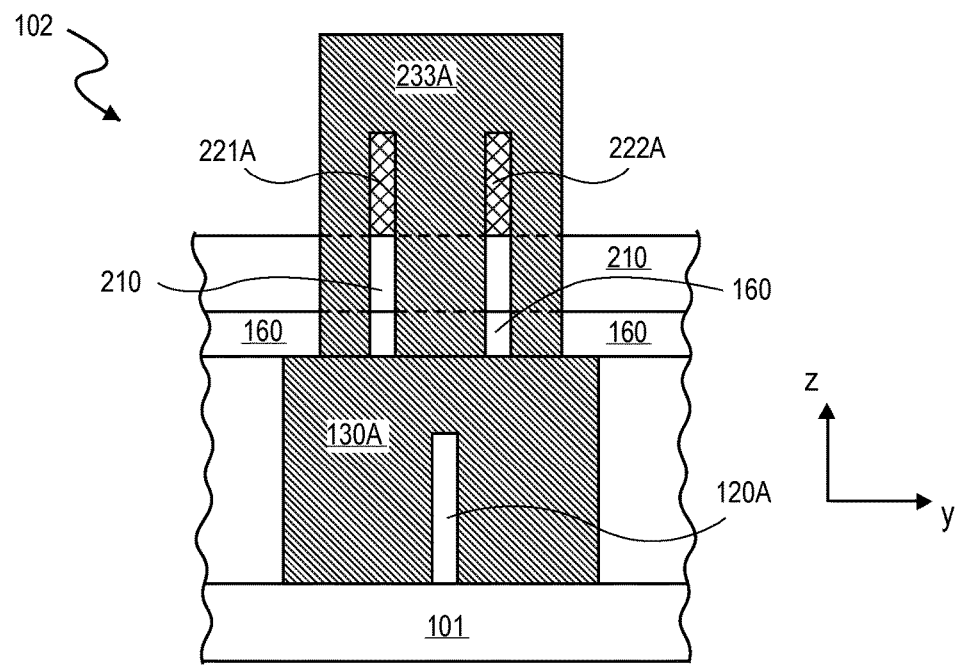
FIG. 2B is a cross-sectional view of an inter-level source/drain interconnect in a monolithic 3D IC, in accordance with an embodiment.

As shown in FIGS. 1A, 1B, and 2A, source/drain metallization 233A electrically couples with source/drain metallization 130A indirectly by way of intervening intra-level interconnect metallization 142A disposed below transistor level 200. FIG. 2B is a cross-sectional view of an inter-level source/drain interconnect in monolithic 3D IC 102, in accordance with an alternate embodiment. In this exemplary embodiment, source/drain metallization 233A electrically connects directly to source/drain metallization 130A with source/drain metallization 233A extending vertically through both inter-level dielectric layer 210 and intra-level dielectric layer 160. Such an embodiment is possible where source/drain metallization 233A is laterally aligned to be directly over source/drain metallization 130A. Depending on the particular circuit, source/drain metallization 233A may also electrically connect directly or indirectly with a gate electrode on transistor level 100, or may electrically connect (e.g., indirectly through an intervening intra-level interconnect) to a plurality of transistor terminals and/or transistors on transistor level 100.

In further embodiments, source/drain metallization top surface 234A may interface the source/drain semiconductor to intra-level interconnect metallization (not depicted) disposed within the second transistor level. Aside from the top surface, source/drain metallization 233A is surrounded by an intra-level dielectric 211. In this manner, the source/drain metallization 233A may further serve the function of a multi-point (3D) source/drain contact as well as a local inter-level interconnect. As such, source/drain metallization 233A may retain substantially the same footprint as for a planar, single-transistor-level (2D) device, which would utilize the source/drain metallization top surface 234A to make an interconnection functionally equivalent to that of source/drain metallization 233A.

Figure 2C:
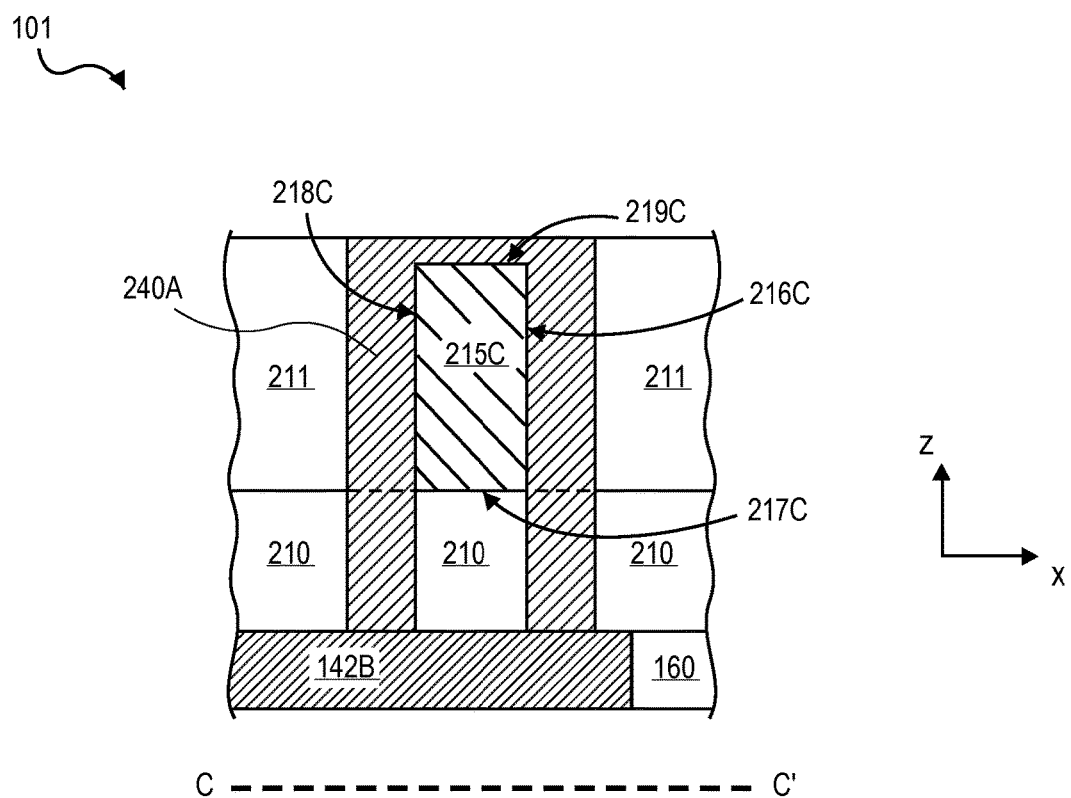
FIG. 2C is a cross-sectional view of an inter-level gate electrode interconnect in the monolithic 3D IC depicted in FIG. 1A, in accordance with an embodiment.

Continuing with description of the second pair of local inter-level interconnects illustrated in FIGS. 1A and 1B, an inter-level gate electrode interconnect generally intersects a gate electrode region of a transistor in a transistor level (e.g., upper). As shown in dashed line in FIG. 1B, inter-level gate electrode interconnect 240A intersects an end portion of the gate electrode 215C. This intersection is further visible in FIG. 2C, which is a cross-sectional view of monolithic 3D IC 101 along a plane that includes the C-C' line in FIG. 1B. For the exemplary embodiment depicted in FIGS. 1B and 2C, inter-level gate electrode interconnect 240A contacts at least one gate electrode sidewall 216C, 218C, and may advantageously contact both opposing gate electrode sidewalls 216C, 218C, as well as gate electrode top surface 219C. In the depicted embodiment, the inter-level gate electrode interconnect 240A extends past (below) gate electrode bottom surface 217C and through inter-level dielectric layer 210 to contact a portion of intra-level interconnect metallization 142B in lateral alignment with inter-level gate electrode interconnect 240A. As shown in FIG. 2C, remnants of inter-level dielectric layer 210 may be disposed under gate electrode bottom surface 217C, for example as masked by the gate electrode. In alternate embodiments, inter-level gate electrode interconnect 240A may additionally contact gate electrode bottom surface 217C to wrap completely around the transverse cross section of the region of gate electrode 215C illustrated in FIG. 2C.

Figure 2D:
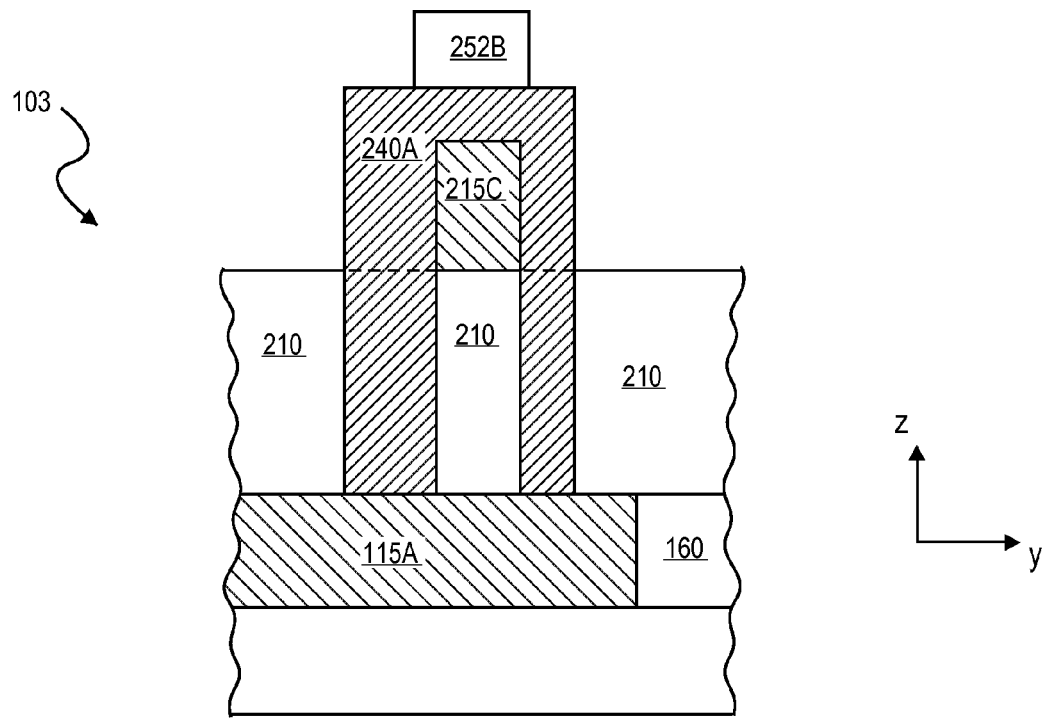
FIG. 2D is a cross-sectional view of an inter-level gate electrode interconnect in a monolithic 3D IC, in accordance with an embodiment.

As shown in FIGS. 1A and 1B, inter-level gate electrode interconnect 240A electrically couples with source/drain metallization 130B indirectly by way of intervening intra-level interconnect metallization 142B disposed below transistor level 200. Inter-level gate electrode interconnect 240A may alternatively electrically connect with source/drain metallization 130B directly if inter-level gate electrode interconnect 240A is laterally aligned to be directly over source/drain metallization 130B. Depending on the circuit, inter-level gate electrode interconnect 240A may also electrically connect directly or indirectly with a gate electrode on transistor level 100, or may electrically couple (e.g., indirectly through an intervening intra-level interconnect) to a plurality of transistor terminals and/or transistors on transistor level 100. For example, as shown in FIG. 2D, which is a cross-sectional view of an inter-level gate electrode interconnect in monolithic 3D IC 103. In accordance with this alternate embodiment, inter-level gate electrode interconnect 240A is disposed over gate electrode 215C and extends down through inter-level dielectric layer 210 to directly contact gate electrode 115A.

In further embodiments, the gate electrode interconnect interfaces a gate electrode to an intra-level interconnect metallization disposed within an upper transistor level. For example, inter-level gate electrode interconnect top surface 241B may interface gate electrode 215C to an intra-level interconnect metallization 252B with the gate electrode otherwise surrounded by the intra-level dielectric 211. In this manner, inter-level gate electrode interconnect 240A may further serve the function of a multi-point (3D) gate electrode contact as well as a local inter-level interconnect. As such, the gate electrode 215C may retain substantially the same footprint as it would for a planar, single-transistor-level (2D) needing to route an intra-level interconnect functionally equivalent to inter-level gate electrode interconnect 240A.

Figure 2E:
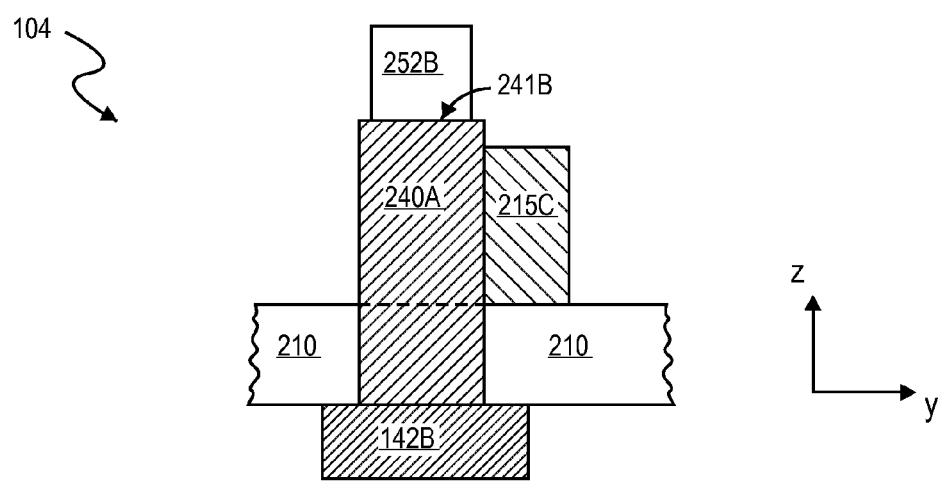
FIG. 2E is a cross-sectional view of an inter-level gate electrode interconnect in a monolithic 3D IC, in accordance with an embodiment.

FIG. 2E is a cross-sectional view of an inter-level gate electrode interconnect in monolithic 3D IC 104, in accordance with an alternate embodiment. In this exemplary embodiment, inter-level gate electrode interconnect 240A abuts only one sidewall of gate electrode 215C, either by design or as a result of manufacturing alignment tolerances. Nevertheless, gate electrode contact and inter-level interconnect functionality is maintained. Also depicted in FIG. 2E is an intra-level interconnect 252B contacting a inter-level gate electrode interconnect top surface 241B, providing a multi-point (3D) interconnect if desired, with no concomitant increase in footprint.

Figure 3:
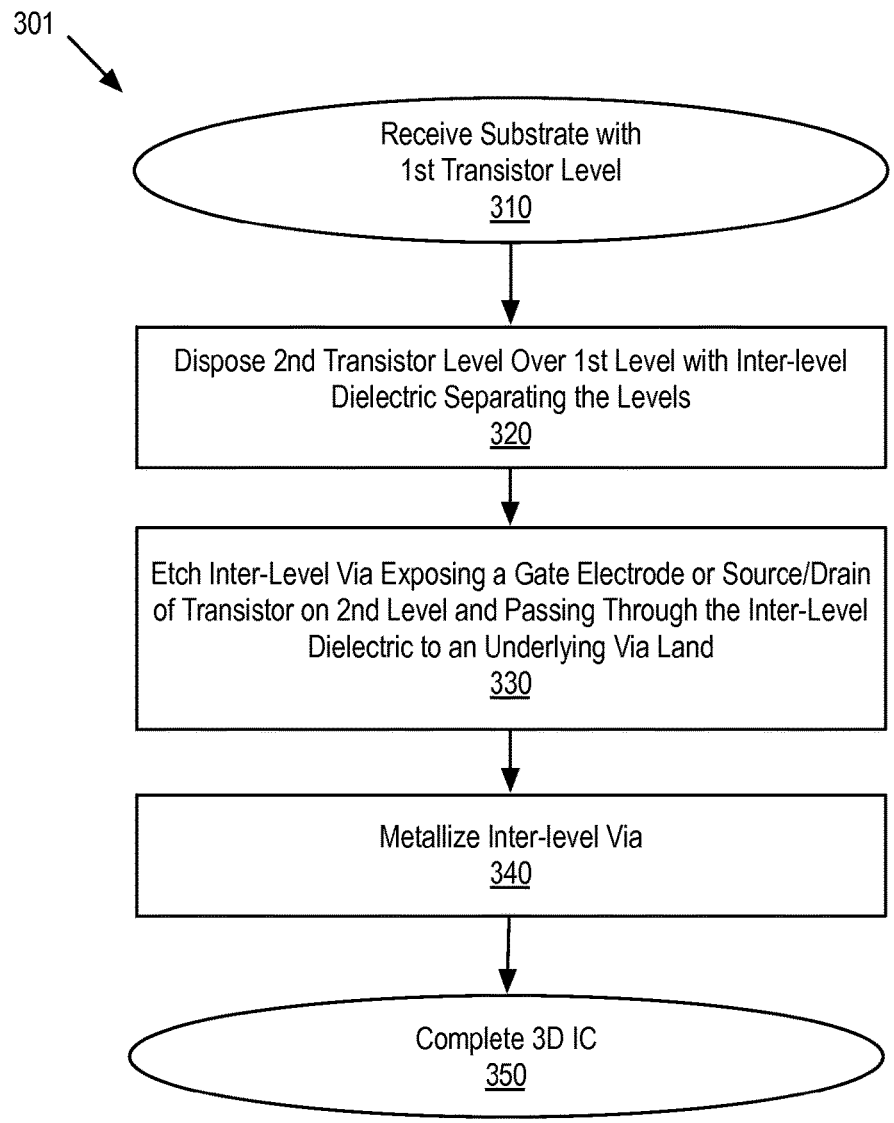
FIG. 3 is a flow diagram illustrating methods of forming a monolithic 3D IC with local inter-level interconnects, in accordance with embodiments.

With a number of structural elements associated with exemplary local inter-level interconnects now described in detail, methods of fabricating local inter-level interconnects to vertically integrate a microelectronic device are further described in reference to the flow diagram in FIG. 3. In the illustrated implementation, process 300 may include one or more operations, functions or actions as illustrated by one or more of operations 310, 320, 330, 340, and/or 350. However, embodiments herein may include any number of operations such that some may be skipped or the like. Further, various embodiments may include additional operations not shown for the sake of clarity.

The exemplary method 301, begins at operation 310 with receipt of a substrate having a first, or lower, transistor level, such as transistor level 100 in FIGS. 1A, 1B. As this first transistor level may have been formed by any conventional means, no further description of its fabrication is provided herein.

Method 301 proceeds to operation 320 where a second transistor level, such as transistor level 200 in FIGS. 1A, 1B, is disposed over the first transistor level. While there are many suitable techniques, as one example, operation 320 entails transferring silicon layer of an SOI substrate onto a host substrate on which the first transistor level is disposed. The transfer may further entail forming an oxide on a surface of the silicon SOI layer, compression bonding the oxide surface to an intra-level dielectric covering the first transistor level, and removing the donor substrate from the silicon SOI layer, for example at the buried insulator layer, etc. Noting there are other methods as well, embodiments are not limited in this respect. After the semiconductor layer transfer, a second, or upper, transistor layer is fabricated, in part, through conventional techniques. For example, the processing performed to fabricate the first transistor layer is repeated until an inter-level interconnect is to be formed.

Method 301 then proceeds to operation 330 where an inter-level via is etched into the second transistor level to expose a gate electrode or a source/drain semiconductor of a transistor on the second transistor level. The inter-level via etch is extended past a base of the transistor on the second transistor level, and clears at least one inter-level dielectric layer to expose an underlying via landing within the first transistor level. The inter-level via etch may be any conventional high aspect ratio etch tuned to have selectivity favoring the target film composition (e.g., that of the inter-level dielectric) over the gate electrode or source/drain semiconductor. In a particular embodiment, the inter-level via etch may be substantially the same as that employed to form a source/drain metallization in the first transistor level, but with a longer duration, for example.

At operation 340, the inter-level via is metallized, for example with any metal fill and planarization technique known in the art to be suitable for the desired metal(s). As one example, a source/drain metallization is deposited on the exposed via land and on the source/drain semiconductor using substantially the same deposition technique(s) (e.g., atomic layer deposition, and/or plating, etc.) employed to form the source/drain metallization within the first transistor level. As one example, a gate electrode interconnect is deposited on the exposed via land and on the gate electrode using substantially the same deposition technique(s) (e.g., atomic layer deposition, and/or plating, etc.) employed to form the gate electrode contact metallization within the first transistor level. Depending on the whether there is more than one type of local inter-level interconnect (e.g., inter-level gate electrode interconnect and inter-level source/drain interconnect), the operations 330 and 340 may be repeated with each iteration opening one type of inter-level via (e.g., exposing a gate electrode or exposing a source/drain semiconductor) and each iteration filling one type of inter-level via. The method 301 then ends with completion of the monolithic 3D IC at operation 350. In one embodiment, completion of the monolithic 3D IC entails only backend interconnect processing formed over the second transistor level. For example, second-level interconnects may be landed on top surfaces of the local inter-level interconnects to electrically connect to both a first-level transistor and to a gate electrode or source/drain of a second-level transistor. In another embodiment, completion of the monolithic 3D IC further entails additional layer transfers and additional repetitions of both conventional transistor fabrication techniques and one or more of the local inter-level interconnect embodiments described herein.

Figure 4A:
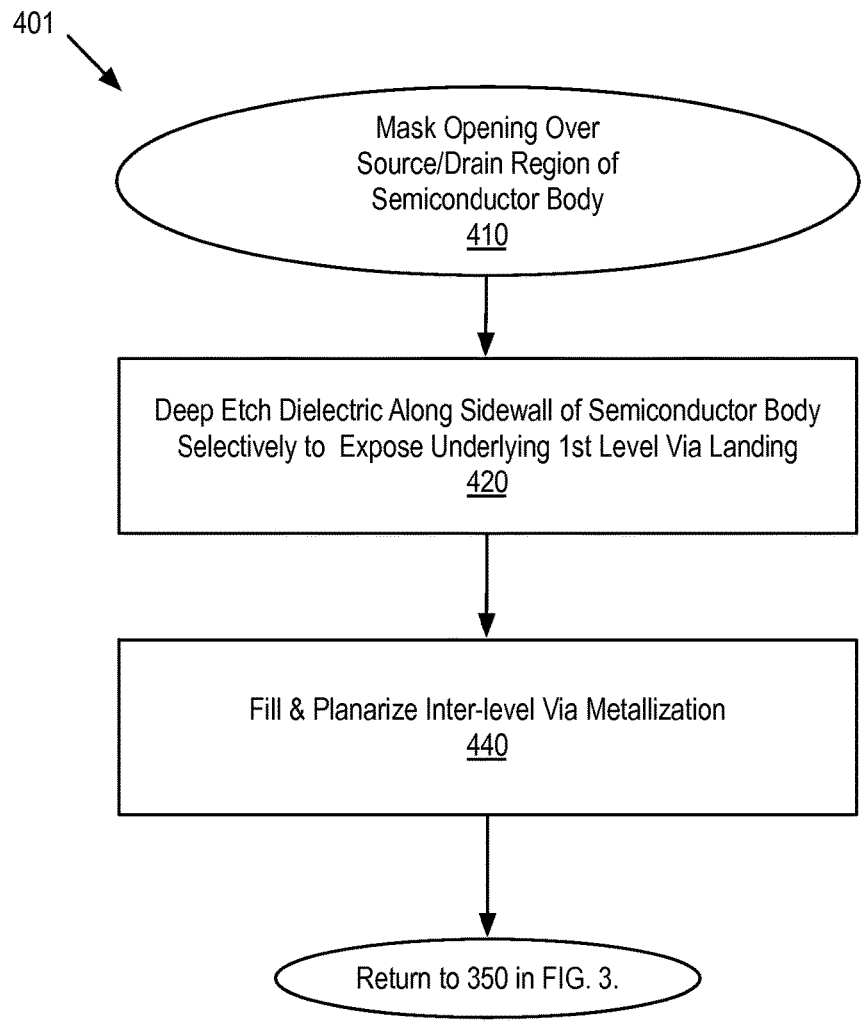
FIG. 4A is a flow diagram illustrating methods of forming an inter-level source/drain interconnect, in accordance with embodiments.
Figure 5A:
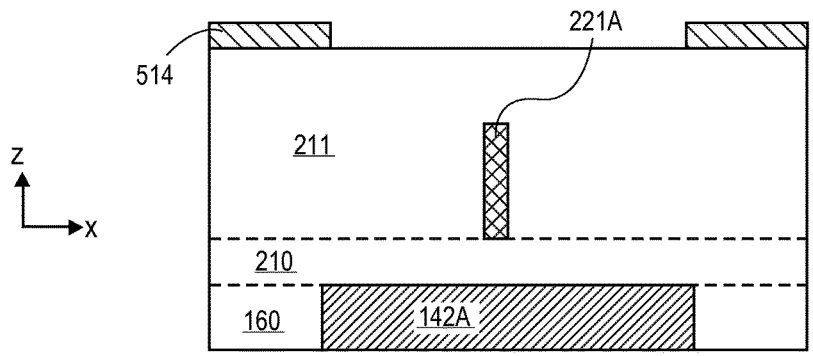
FIGS. 5A, 5B, 5C, and 5D are cross-sectional views of an inter-level source/drain interconnect region as particular fabrication operations illustrated in FIG. 4A are performed, in accordance with an embodiment.
Figure 5B:
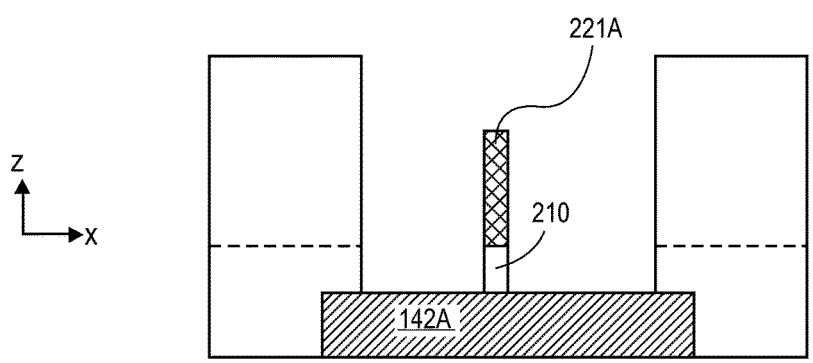
Figure 5C:
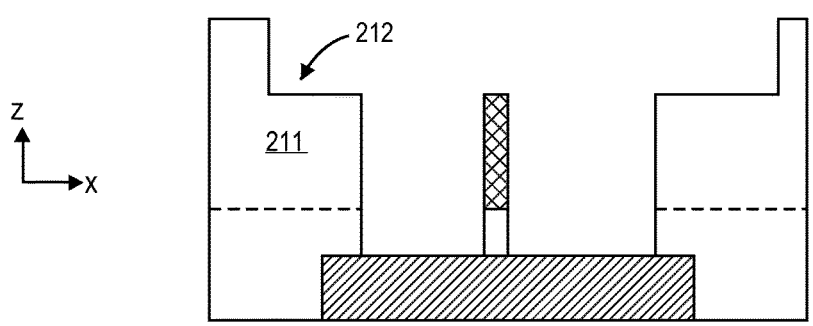
Figure 5D:
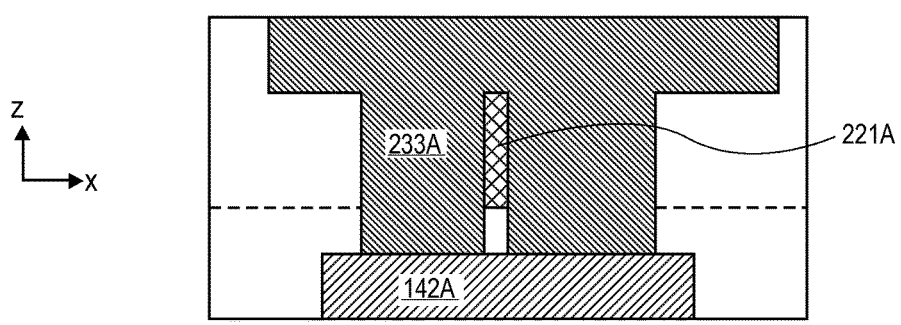

Additional description of various operations particular to inter-level source/drain interconnect fabrication method 401 is provided in the context of the flow diagram in FIG. 4A with FIGS. 5A-5D providing cross-sectional views of an inter-level source/drain interconnect region as particular fabrication operations of the method 401 are performed, in accordance with an embodiment. Referring first to FIG. 4A, method 401 begins at operation 410 with formation of an opening over an upper level transistor source/drain region of a semiconductor body. For example, as illustrated in FIG. 5A, mask 514 is formed over intra-level dielectric layer 211 with features of mask 514 aligned with respect to a source/drain region of underlying semiconductor body 221A. Method 401 (FIG. 4A) proceeds to operation 420 where a deep dielectric etch is performed to expose at least a portion (e.g., one sidewall) of a semiconductor source/drain region and expose an underlying via landing in a lower transistor level. As shown in FIG. 5A, etch operation 420 clears intra-level dielectric 211 to expose a top surface and two opposing sidewalls of semiconductor body 221A, and clears inter-level dielectric layer 210 to expose a portion of intra-level interconnect metallization 142A aligned to a feature in mask 514. A conventional dielectric etch, such as an anisotropic plasma etch, may be utilized for etch operation 420, which may leave a remnant of inter-level dielectric layer 210 disposed directly under semiconductor body 221A. Alternatively, a slightly isotropic etch or a combination of anisotropic and isotropic etches may be utilized to undercut the source/drain region of second-level transistor fin 221A. FIG. 5C further illustrates a specific embodiment where the operation 420 entails dual-damascene type processing, where trenches 212 are further formed into the intra-level dielectric 211. Returning to FIG. 4A, the method 401 concludes at operation 440 where the inter-level via is filled with metallization and planarized. As shown in FIG. 5D, the source/drain metallization 233A contacts both the intra-level interconnect metallization 142A and the source/drain region of semiconductor body 221A.

Figure 4B:
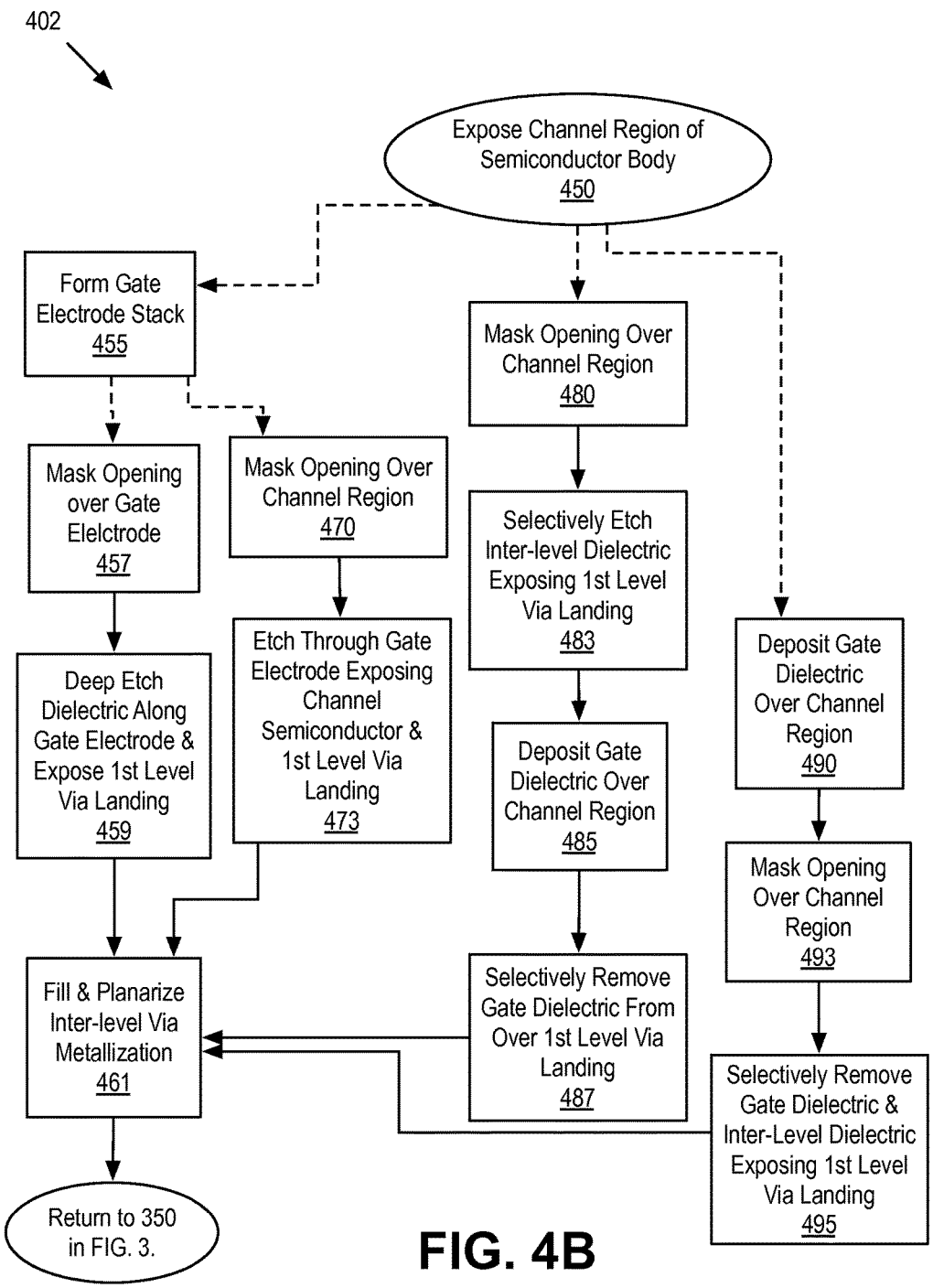
FIG. 4B is a flow diagram illustrating methods of forming an inter-level gate electrode interconnect, in accordance with embodiments.

Description of various operations particular to an inter-level gate electrode interconnect fabrication method 402 is provided in the context of the flow diagram in FIG. 4B with FIGS. 6A-6C, 7A-7D, 8A-8F, and 9A-9D providing cross-sectional views of an inter-level gate electrode interconnect region as particular operations of the method 402 are performed, in accordance with embodiments. Referring first to FIG. 4B, method 402 begins at operation 450 with exposing an upper level transistor channel region of a semiconductor body. Generally, operation 450 may be performed in any manner conventional to a replacement gate process where a placeholder or mandrel gate stack (e.g., polysilicon on silicon dioxide) is removed from the upper level transistor in preparation for insertion of a high-k/metal gate electrode.

With the placeholder gate removed and the channel semiconductor region exposed, the inter-level gate electrode interconnect may be formed before, after, or during the replacement gate process. For example, method 402 either proceeds to operation 455 where a complete replacement gate stack (high-k dielectric/metal gate) is formed over the exposed channel region before etching an inter-level via, or proceeds to operation 480 where an inter-level via is formed before any replacement gate stack is formed over the exposed channel region, or proceeds to operation 490 where a replacement gate dielectric is formed over the exposed channel region before etching an inter-level via. For the latter alternatives, the inter-level gate electrode interconnect essentially intersects the channel-coupling portion of the gate electrode exactly, while for the first alternative the inter-level gate electrode interconnect intersects a portion of the gate electrode distal from the channel region (e.g., as is depicted in FIGS. 1A, 1B).

Figure 6A:
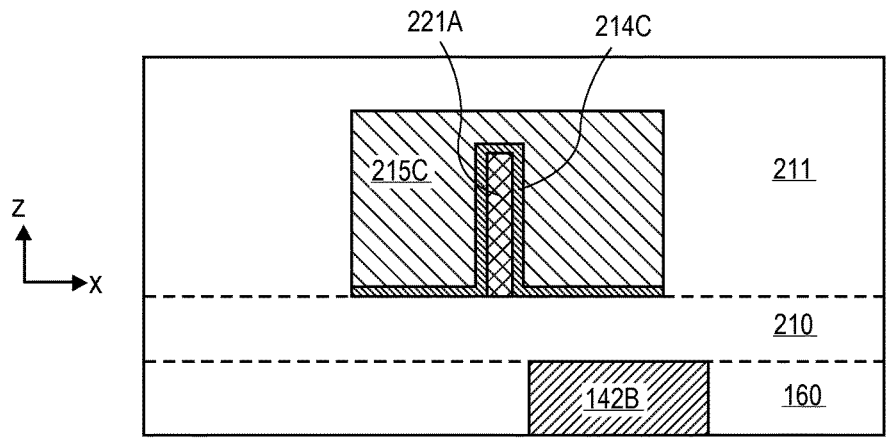
FIGS. 6A, 6B, and 6C are cross-sectional views of an inter-level gate electrode interconnect region as particular fabrication operations illustrated in FIG. 4B are performed, in accordance with an embodiment.
Figure 6B:
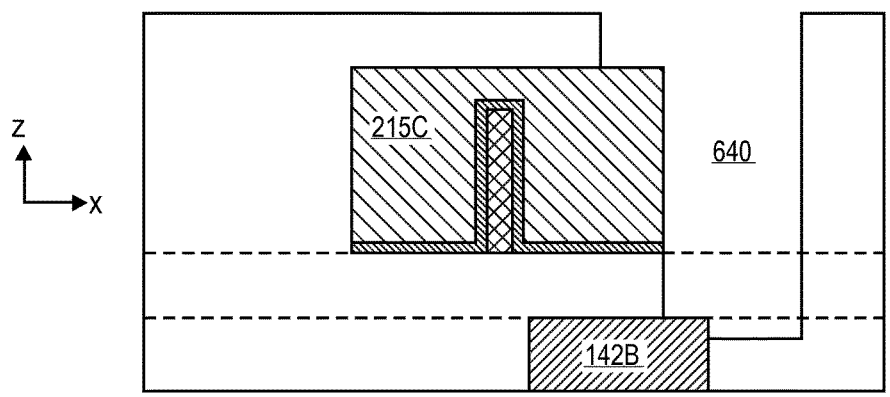
Figure 6C:
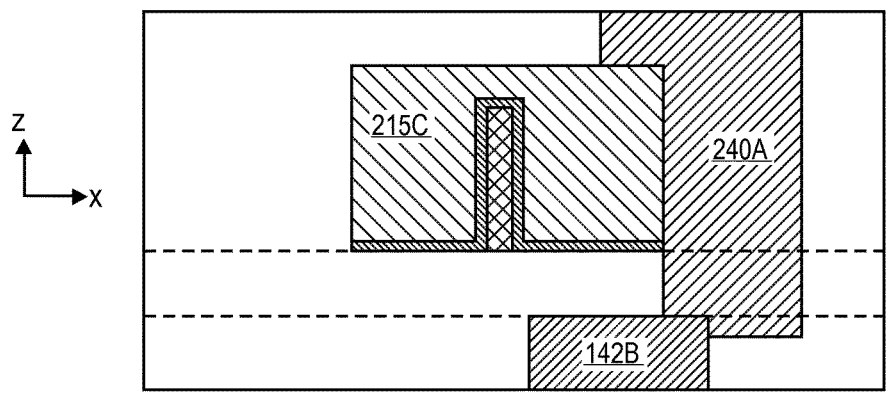

FIG. 6A illustrates a gate electrode inter-level interconnect region following operation 455 where a gate stack including gate dielectric 214C (e.g., silicon dioxide, and/or high-K material) and gate electrode 215C is formed over a channel region of semiconductor body 221A. Returning to FIG. 4B, following operation 455, method 401 either proceeds to operation 457 where dielectric surrounding a portion of the gate electrode distal from the channel region is to be exposed by an inter-level via, or proceeds to operation 470 where the channel region is to be exposed by an inter-level via. FIG. 6B illustrates an example of the former where a mask opening is formed over gate electrode 215C and intra-level dielectric 211 with a deep dielectric etch of intra-level dielectric 211 and inter-level dielectric layer 210 forming inter-level via 640. In further reference to FIG. 4B, the deep dielectric etch operation 459 may be substantially as described for dielectric etch operation 420 (FIG. 4A). Method 402 then proceeds with metallization operation 461 where any suitable metal is deposited into the inter-level via to contact both a gate electrode of an upper level transistor and a via landing coupling to a terminal of a transistor in the lower transistor level. For example, as shown in FIG. 6C, an inter-level gate electrode interconnect 240A comprising a metal that makes ohmic contact with at least a sidewall of gate electrode 215C and with a portion of the intra-level interconnect 142B, is deposited within inter-level via 640. With the gate electrode inter-level interconnect fabricated, the method 402 then returns to operation 350 of method 301 (FIG. 3).

Figure 7A:
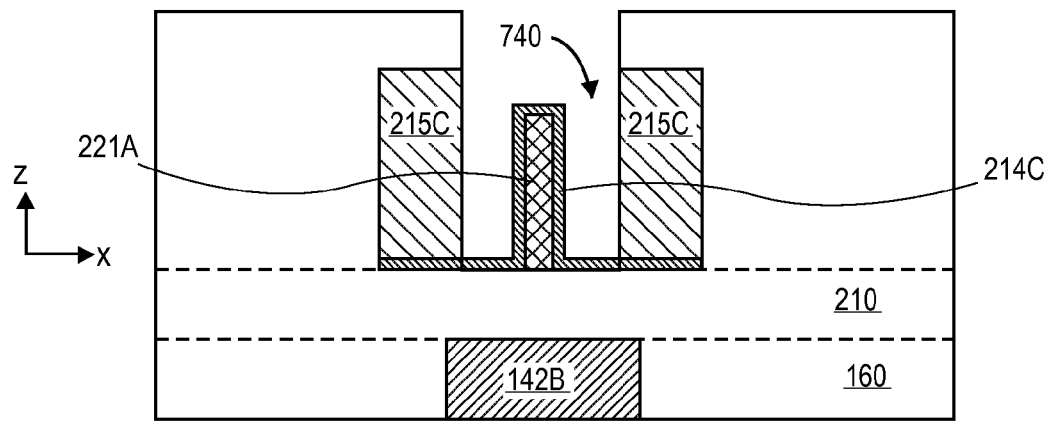
FIGS. 7A, 7B, 7C, and 7D are cross-sectional views of an inter-level gate electrode interconnect region as particular fabrication operations illustrated in FIG. 4B are performed, in accordance with an embodiment.
Figure 7B:
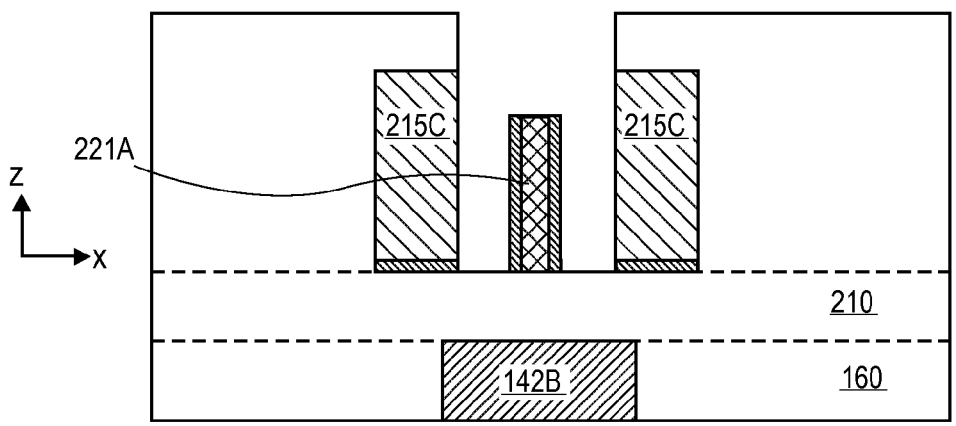
Figure 7C:
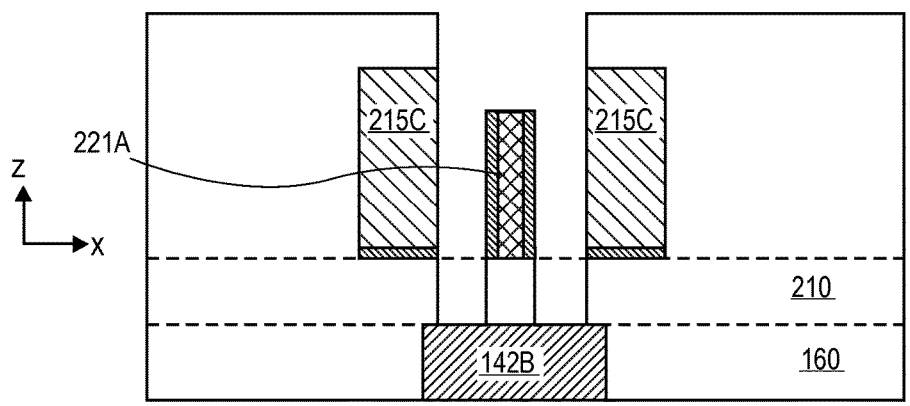
Figure 7D:
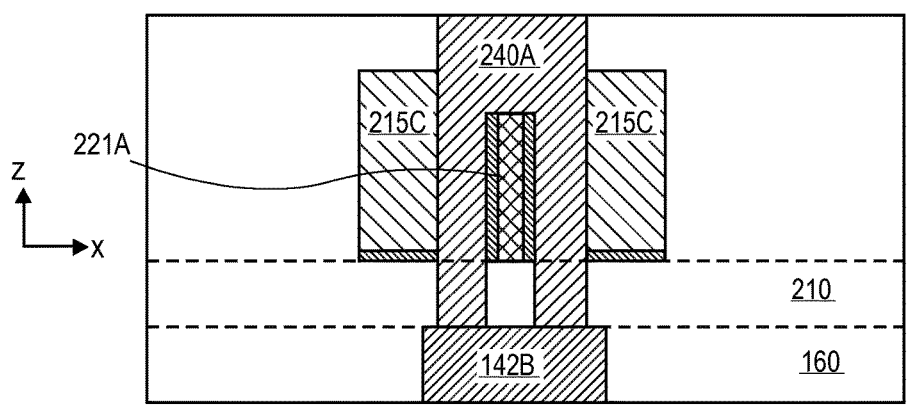

For the alternative embodiment where the channel region is to be exposed by an inter-level via, a mask opening is aligned over the channel region at operation 470 if the inter-level via is to occupy only a portion of the region previously occupied by the placeholder gate, and the gate electrode is etched at operation 473. For example, as shown in FIG. 7A, gate electrode 215C is etched through to expose gate dielectric 214C at a bottom of via 740. As shown in FIG. 7B, a subsequent anisotropic etch then clears the gate dielectric from bottom of the via 740. A top surface of semiconductor body 221A may also be exposed during the gate dielectric etch, however sidewalls of semiconductor body 221A remain covered by the gate dielectric. As shown in FIG. 7C, the via etch proceeds to clear inter-level dielectric layer 210 to land on intra-level interconnect 142B. Inter-level gate electrode interconnect 240A is then completed with metal fill and planarization operation 461, as described elsewhere herein. For such embodiments, method 402 results in the gate electrode interconnect structure illustrated in FIG. 7D, which differs from the structures illustrated in FIGS. 1A and 1B at least to the extent that for the embodiment illustrated in FIG. 7D, gate electrode inter-level interconnect 240A is disposed proximate to a channel region of semiconductor body 221A, separated by only gate dielectric 814C. Method 402 then returns to method 301 for completion of the 3D IC.

Figure 8A:
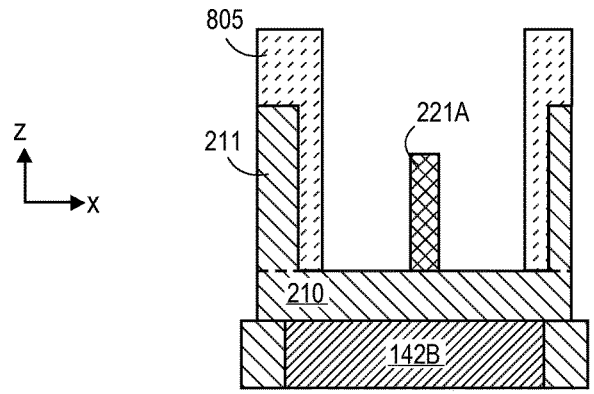
FIGS. 8A, 8B, 8C, and 8D and are cross-sectional views of an inter-level gate electrode interconnect region as particular fabrication operations illustrated in FIG. 4B are performed, in accordance with an embodiment.
Figure 8B:
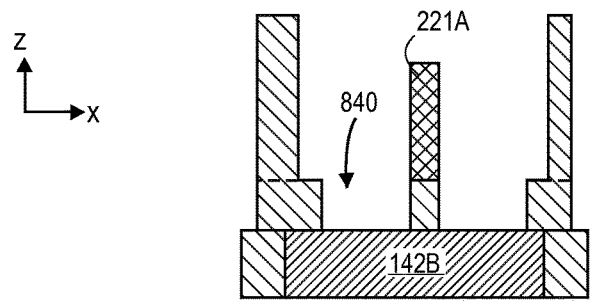
Figure 8C:
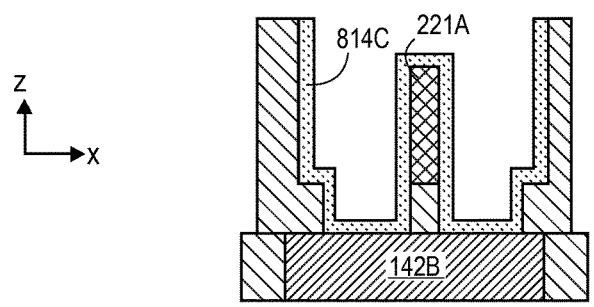
Figure 8D:
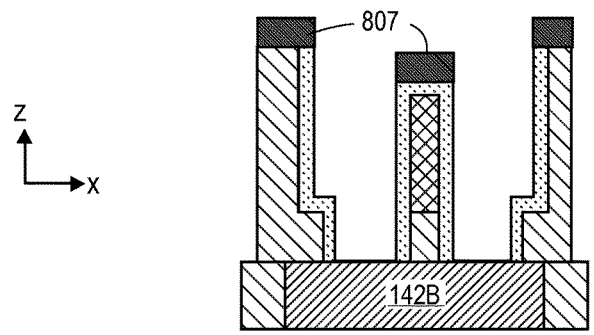
Figure 9A:
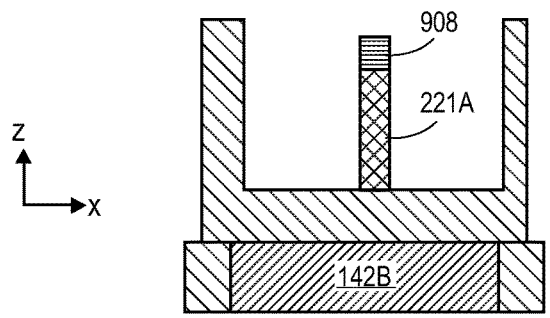
FIGS. 9A, 9B, 9C, and 9D and are cross-sectional views of an inter-level gate electrode interconnect region as particular fabrication operations illustrated in FIG. 4B are performed, in accordance with an embodiment.
Figure 9B:
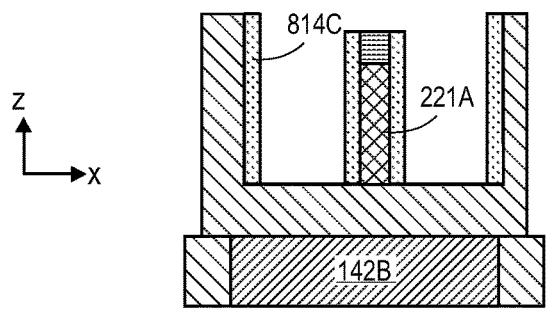
Figure 9C:
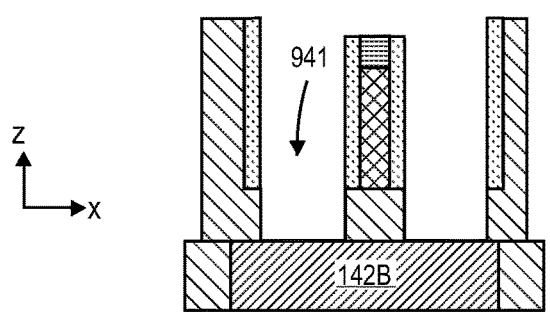
Figure 9D:
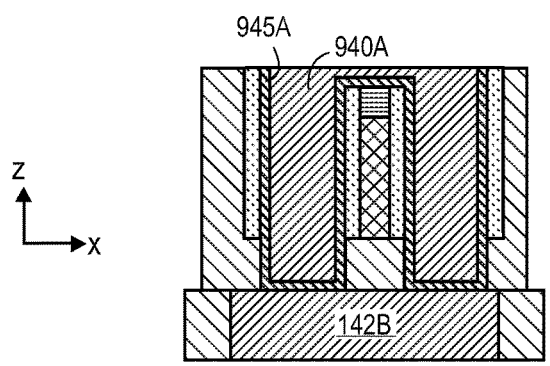

Returning to FIG. 4B, in alternative embodiments, where method 402 proceeds to operation 480 with an inter-level via formed before any replacement gate stack is formed over the exposed channel region, a mask opening is formed over the channel region if the inter-level via is to occupy only a portion of the region previously occupied by the placeholder gate. For example, as shown in FIG. 8A, mask 805 defines an opening smaller than the width of the placeholder gate. Returning to FIG. 4B, at operation 483, the inter-level dielectric is etched selectively to the channel semiconductor. For example, as depicted in FIG. 8B, inter-level dielectric layer 210 is removed exposing a portion of intra-level interconnect 142B at a bottom of inter-level via 840. Method 402 (FIG. 4B) then proceeds to operation 485 where the gate dielectric is formed using any conventional technique. For example, as shown in FIG. 8C, gate dielectric 814C is deposited over the exposed channel region of semiconductor body 221A. Any gate dielectric present on intra-level interconnect 142B is then selectively removed, for example by first selectively forming protective mask 807 on only the top surface topology, as shown in FIG. 8D. Method 402 may then proceed with removing protective mask 807 (if present) and performing metal fill and planarization operation 461. As evident from FIG. 8D, following the metal fill, the first inter-level interconnect is separated from a sidewall of a channel region of semiconductor body 221A by only gate dielectric 814C. In further contrast to certain other embodiments described elsewhere herein, gate dielectric 814C also remains between the inter-level interconnect and inter-level dielectric layer 210. Method 402 then returns to method 301 for completion of the monolithic 3D IC. In certain embodiments, the gate dielectric is disposed over a protective hardmask present on a top surface the semiconductor body, in which case removal of the gate dielectric from a top surface of the semiconductor body, as was depicted in FIG. 7B, has little effect on transistor operation since the transistor is essentially a bi-gate, or dual-gate device.

In alternative embodiments, method 402 proceeds to operation 490 with formation of a replacement gate dielectric over the exposed channel region at before any masking and etching of an inter-level via at operations 493, and 495, respectively. Here too, any gate dielectric formation process may be utilized at operation 490. After forming any suitable mask opening of the channel region at operation 493 to limit the footprint of the inter-level via to less than that of the placeholder gate, the inter-level via is etched at operation 495 in a manner that clears the gate dielectric and inter-level dielectric substantially as was described in the context of operation 473 and FIGS. 7B, 7C. An example of such an embodiment is further illustrated in FIGS. 9A-9C where etching of inter-level via 941 after formation of the gate dielectric ensures there is no gate dielectric below the base of the semiconductor body 221A. This is one structural attribute distinct from the gate dielectric structure formed when the inter-level via is etched before the gate dielectric is formed (e.g., as depicted in FIG. 8D). In certain embodiments, the gate dielectric is disposed over a protective hardmask present on a top surface the semiconductor body. For example, a protective hardmask 908 is present in the FIGS. 9A-9D. In such embodiments, removal of the gate dielectric during the inter-level via etch has little, if any, effect on transistor operation because the transistor is essentially a bi-gate, or dual-gate device with hardmask 908 in place.

In certain other embodiments, the gate dielectric etch is made selective; with removal of the gate dielectric along the bottom of the semiconductor fin and retention of the gate dielectric disposed on a top surface of the semiconductor fin. For example, a protective mask may be formed on top of the gate dielectric, substantially as was illustrated in the context of operation 487 and FIG. 8D. With the gate dielectric removed from the inter-level via landing, method 402 proceeds with metal filling of the inter-level via at operation 461. In the specific example shown in FIG. 9D, the fill metal includes a work function metal 945A and a bulk metal 940A. Method 402 then returns to method 301 (FIG. 3) for completion of the 3D IC.

Figure 10:
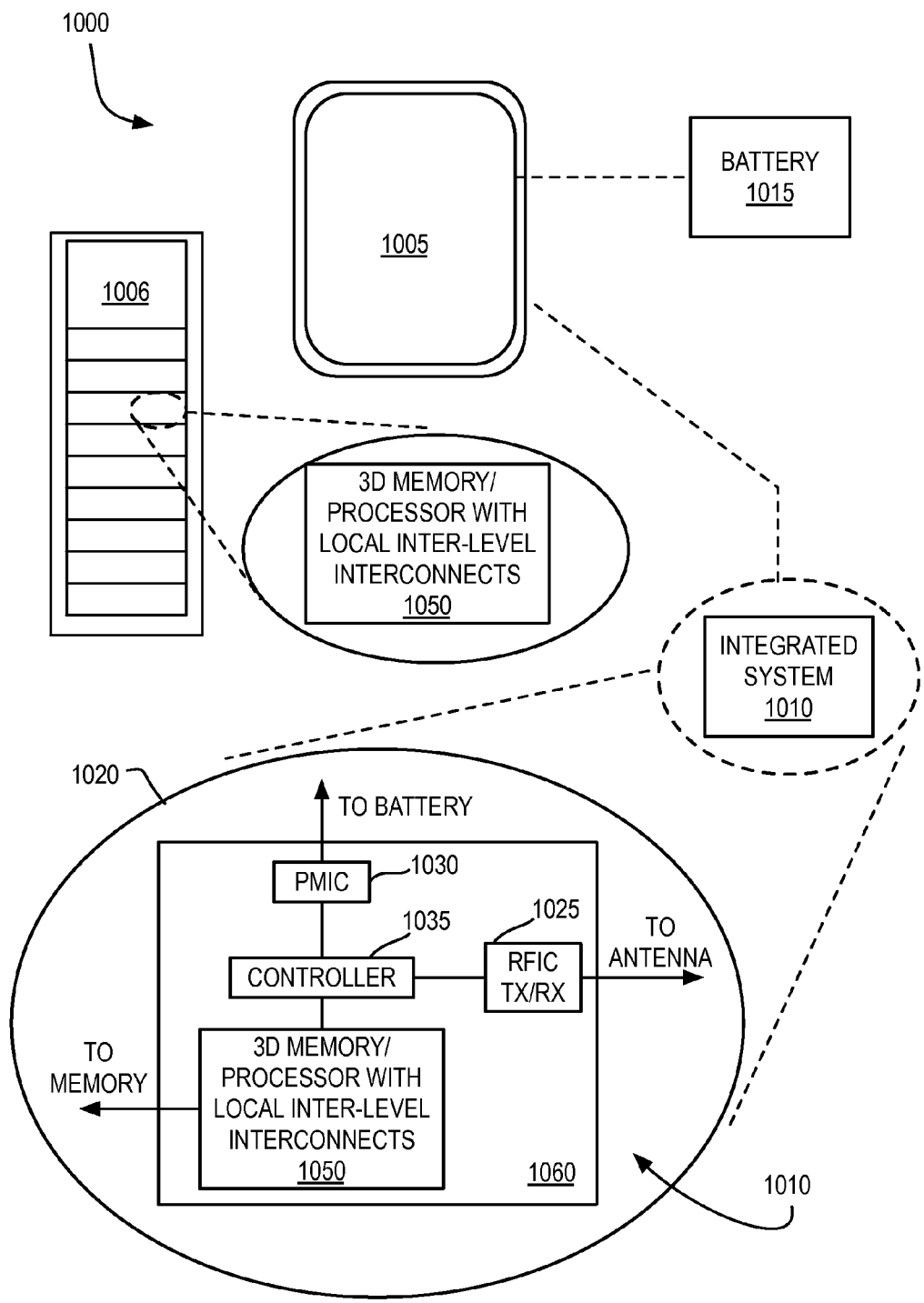
FIG. 10 illustrates a mobile computing platform and a data server machine employing a monolithic 3D IC with local inter-level interconnects, in accordance with embodiments of the present invention.

FIG. 10 illustrates a system 1000 in which a mobile computing platform 1005 and/or a data server machine 1006 employs a monolithic 3D IC with local inter-level interconnects, in accordance with embodiments of the present invention. The server machine 1006 may be any commercial server, for example including any number of high performance computing platforms disposed within a rack and networked together for electronic data processing, which in the exemplary embodiment includes a packaged monolithic 3D IC 1050. The mobile computing platform 1005 may be any portable device configured for each of electronic data display, electronic data processing, wireless electronic data transmission, or the like. For example, the mobile computing platform 1005 may be any of a tablet, a smart phone, laptop computer, etc., and may include a display screen (e.g., a capacitive, inductive, resistive, touchscreen), a chip-level or package-level integrated system 1010, and a battery 1015.

Whether disposed within the integrated system 1010 illustrated in the expanded view 1020, or as a stand-alone packaged chip within the server machine 1006, packaged monolithic 3D IC 1050 includes a memory chip (e.g., RAM), or a processor chip (e.g., a microprocessor, a multi-core microprocessor, graphics processor, or the like) employing a monolithic 3D architecture with at least two levels of transistors interconnected by at least one local inter-level interconnect. In an embodiment, monolithic 3D IC 1050 is a microprocessor including an SRAM cache memory employing a plurality of cells, each of which has at least two levels of transistors interconnected by at least one local inter-level interconnect. For example, the SRAM cache memory may couple the gates of drive transistors to gates of load transistors by gate electrode inter-level interconnects and may couple drains of the drive transistors to drains of the load transistors by source/drain inter-level interconnects, substantially as described elsewhere herein. One or more inter-level interconnect may intersect a gate electrode or source/drain semiconductor region of an n-type transistor in an in an upper level of an SRAM cell and further electrically couple to a terminal of a p-type transistor that is in a lower level of the same SRAM cell. The monolithic 3D IC 1050 may be further coupled to a board, a substrate, or an interposer 1060 along with, one or more of a power management integrated circuit (PMIC) 1030, RF (wireless) integrated circuit (RFIC) 1025 including a wideband RF (wireless) transmitter and/or receiver (TX/RX) (e.g., including a digital baseband and an analog front end module further comprises a power amplifier on a transmit path and a low noise amplifier on a receive path), and a controller thereof 1035.

Functionally, PMIC 1030 may perform battery power regulation, DC-to-DC conversion, etc., and so has an input coupled to battery 1015 and with an output providing a current supply to other functional modules. As further illustrated, in the exemplary embodiment, RFIC 1025 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the monolithic 3D IC 1050 or within a single IC coupled to the package substrate of the monolithic 3D IC 1050.

Figure 11:
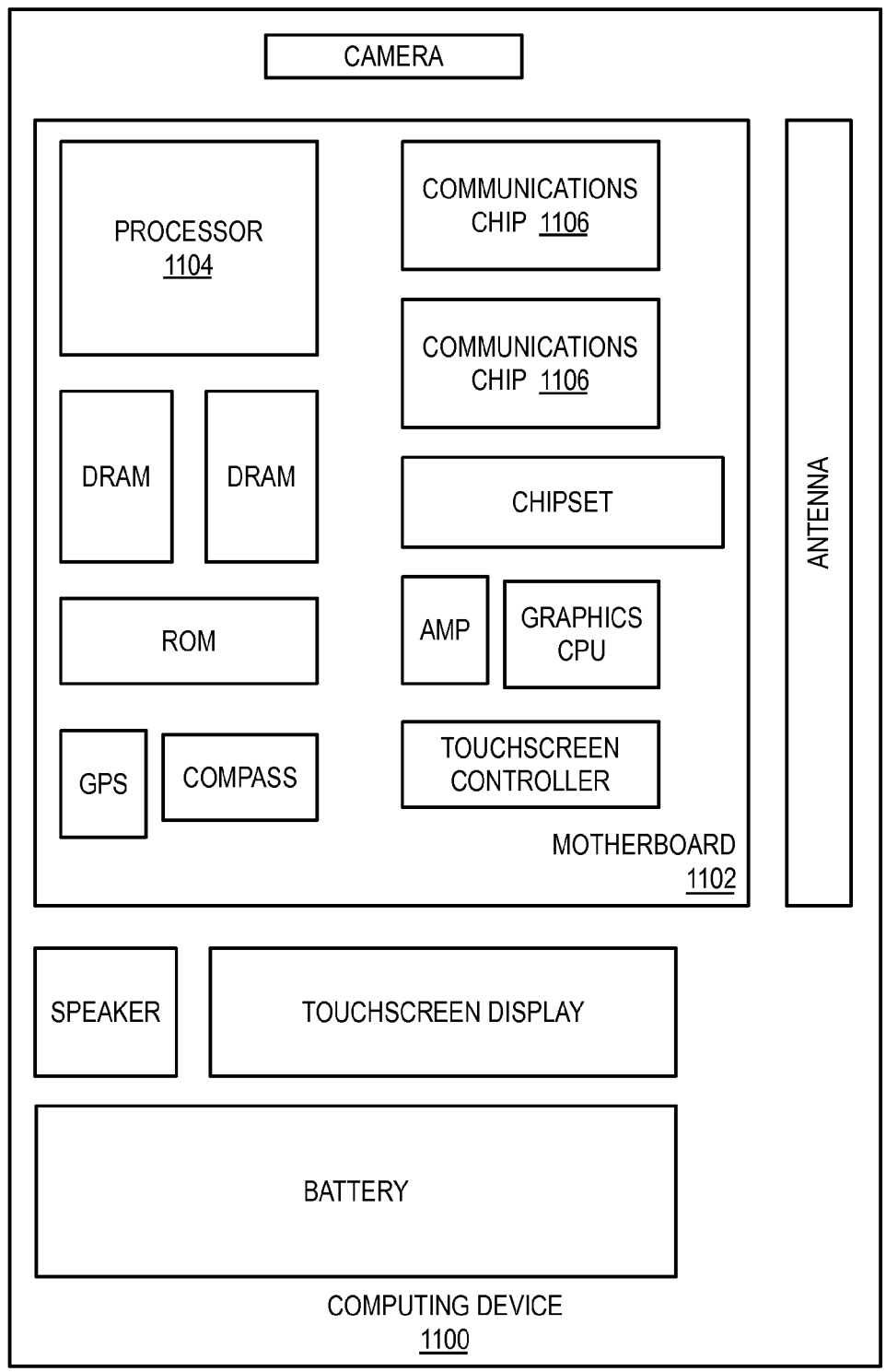
FIG. 11 is a functional block diagram of an electronic computing device, in accordance with an embodiment of the present invention.

FIG. 11 is a functional block diagram of a computing device 1100, arranged in accordance with at least some implementations of the present disclosure. Computing device 1100 may be found inside platform 1005 or server machine 1006, for example, and further includes a motherboard 1102 hosting a number of components, such as but not limited to a processor 1104 (e.g., an applications processor), which may incorporate local inter-level interconnects as discussed herein, and at least one communication chip 1106. In embodiments, at least one of the processor 1104 one or more communication chips 1106, or the like. Processor 1104 may be physically and/or electrically coupled to motherboard 1102. In some examples, processor 1104 includes an integrated circuit die packaged within the processor 1104. In general, the term "processor" or "microprocessor" may refer to any device or portion of a device that processes electronic data from registers and/or memory to transform that electronic data into other electronic data that may be stored in registers and/or memory.

In various examples, one or more communication chips 1106 may also be physically and/or electrically coupled to the motherboard 1102. In further implementations, communication chips 1106 may be part of processor 1104. Depending on its applications, computing device 1100 may include other components that may or may not be physically and electrically coupled to motherboard 1102. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid state drive (SSD), compact disk (CD), digital versatile disk (DVD), and so forth), or the like.

Communication chips 1106 may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1106 may implement any of a number of wireless standards or protocols, including but not limited to those described elsewhere herein. As discussed, computing device 1100 may include a plurality of communication chips 706. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following examples pertain to particular exemplary embodiments.

A vertically integrated microelectronic device may include, a first transistor including a first semiconductor body extending laterally within a first transistor level disposed over a substrate, a second transistor including a second semiconductor body extending laterally within a second transistor level disposed over the substrate and vertically separated from the first transistor level by one or more inter-level dielectric layers, and a gate electrode disposed over a channel region between a pair of source/drain regions of the second semiconductor body, such that there is a first inter-level interconnect intersecting the gate electrode or one of the source/drain regions, extending through at least one of the one or more inter-level dielectric layers, and electrically coupling with a terminal of the first transistor.

In a further example, the second transistor level is disposed over the first transistor level with the second semiconductor body disposed over the one or more inter-level dielectric layers, the second semiconductor body comprises a fin, and the first inter-level interconnect is disposed along at least one sidewall of a source/drain region of the fin In a further example, the second transistor level is disposed over the first transistor level with the second semiconductor body disposed over the one or more inter-level dielectric layers, the second semiconductor body comprises a fin, and the first inter-level interconnect is disposed along at least two opposing sidewalls of a source/drain region of the fin, and electrically couples with a source/drain region of the first semiconductor body.

In a further example, the second transistor level is disposed over the first transistor layer with the second semiconductor body disposed over the one or more inter-level dielectric layers, and the first inter-level interconnect electrically couples with the terminal through a first intervening interconnect metallization disposed below the second transistor level.

In a further example, the second transistor level is disposed over the first transistor level with the second semiconductor body disposed over the one or more inter-level dielectric layers, and the first inter-level interconnect is disposed along at least one sidewall of the gate electrode.

In a further example, the second transistor level is disposed over the first transistor level with the second semiconductor body disposed over the one or more inter-level dielectric layers, the second semiconductor body comprises a fin, the first inter-level interconnect is disposed along at least one sidewall of a source/drain region of the fin, and the device further has a second inter-level interconnect disposed along at least one sidewall of the gate electrode and extending through at least one of the one or more inter-level dielectric layers and electrically interconnecting with a transistor in the first transistor level.

In a further example, the second transistor level is disposed over the first transistor level with the second semiconductor body disposed over the one or more inter-level dielectric layers, the second semiconductor body comprises a fin, the first inter-level interconnect is disposed along at least two opposing sidewalls of a source/drain region of the fin, electrically couples with a source/drain terminal through a first intervening interconnect metallization disposed below the second transistor level, and the device further has a second inter-level interconnect disposed along at least one sidewall of the gate electrode, extending through at least one of the one or more inter-level dielectric layers, electrically interconnecting with a transistor in the first transistor level through a second intervening interconnect metallization disposed below the second transistor level.

In a further example, the first inter-level interconnect is separated from a sidewall of a channel region of the second semiconductor body by only a gate dielectric.

In a further example, the first inter-level interconnect is separated from a sidewall of a channel region of the second semiconductor body by only a gate dielectric, and wherein the gate dielectric is further disposed between the first inter-level interconnect and at least one of the one or more inter-level dielectric layers.

In a further example, the first inter-level interconnect is separated from a sidewall of a channel region of the second semiconductor body by only a gate dielectric, and wherein the first inter-level interconnect is in direct contact with at least one of the one or more inter-level dielectric layers.

In a further example, a 3D SRAM cache memory may have multiple levels of transistor in each 3D SRAM cell coupled through any of the above exemplary local inter-level interconnect structures. As one example, 3D SRAM bit cell has two load transistors disposed on a first transistor level over a substrate, two drive transistors and two pass-gate transistors disposed on a second transistor level over the first transistor level, with an inter-level dielectric layer disposed there between, a first pair of inter-level interconnects, each contacting a semiconductor drain region of one of the drive transistors and extending through the inter-level dielectric layer, and a second pair of inter-level interconnects, each contacting a gate electrode of one of the drive transistors and extending through the inter-level dielectric layer. In a further example, the first and second pairs of inter-level interconnect electrically couples a terminal of the load transistors.

In a further example of a 3D SRAM cell, the load and drive transistors comprise laterally-oriented fins having semiconductor channel regions disposed over first areas of the substrate adjacent to the semiconductor drain regions disposed over second areas of the substrate, and the first and second pairs of inter-level interconnects electrically couple to terminals of the load transistors and extend vertically through the inter-level dielectric layer, substantially orthogonal to the laterally-oriented fins.

In a further example of a 3D SRAM cell, one of the first pair and one of the second pair of inter-level interconnects electrically couples to a drain terminal of a first of the two load transistors and a gate electrode of a second of the two load transistors while another of the first pair and another of the second pair of inter-level interconnects electrically couples to a drain terminal of the second of the two load transistors and a gate electrode of the first of the two load transistors. Furthermore, each of the first pair of inter-level interconnects is disposed along at least two opposing sidewalls of the drain region, and contacts a separate intervening interconnect metallization disposed below the second transistor, while each of the second pair of inter-level interconnects is disposed along at least one sidewall of the gate electrode or at least one sidewall of a semiconductor channel region of one of the drive transistors, and contacts one of the separate intervening interconnect metallizations.

In a further example, a microprocessor includes an SRAM cache memory, wherein the SRAM cache memory further includes the monolithic 3D SRAM cell. In a further example, a mobile computing platform includes the microprocessor, as well as a display screen communicatively coupled to the microprocessor, and a wireless transceiver communicatively coupled to the microprocessor.

In an example of a method of fabricating a vertically integrated microelectronic device, the method may include receiving a first transistor disposed over a substrate, disposing a second transistor over the first transistor to have one or more inter-level dielectric layers disposed there between, and interconnecting the first and second transistors by etching a first inter-level via that intersects a gate electrode or a semiconductor source/drain region of the second transistor, extends through at least one of the one or more inter-level dielectric layers, and exposes a first conductive via land that is electrically coupled to the first transistor, and then depositing a first inter-level interconnect in the first inter-level via, the metal contacting both the first via land and at least one of the gate electrode and the semiconductor source/drain region.

In a further example of a fabrication method, the semiconductor source/drain region is disposed in a portion of a semiconductor fin, etching the first inter-level via exposes at least one fin sidewall, depositing the first inter-level interconnect further comprises depositing a source/drain metallization on at least the fin sidewall, and the first via land is a portion of an interconnect metallization contacting at least one of a gate electrode or a semiconductor source/drain region of the first transistor.

In a further example of a fabrication method, the semiconductor source/drain region is disposed in a semiconductor fin, etching the first inter-level via exposes a top and two opposing fin sidewalls and further exposes a portion of an intra-level interconnect metallization contacting a semiconductor source/drain region of the first transistor, and depositing the first inter-level interconnect further comprises depositing a source/drain diffusion metallization onto the fin top, on the two fin sidewalls, and on the exposed portion of the intra-level interconnect metallization.

In a further example of a fabrication method, etching the first inter-level via exposes a gate electrode top and a gate electrode sidewall, depositing the first inter-level interconnect further comprises depositing a gate contact metallization onto the gate electrode top and sidewall, and the first via land is a portion of an interconnect metallization contacting at least one of a gate electrode or a semiconductor source/drain region of the first transistor.

In a further example of a fabrication method, forming a second level via landing on a top surface of the first inter-level interconnect to electrically connect to both the first transistor and to the gate electrode or source/drain of the second transistor.

In a further example of a fabrication method, the semiconductor source/drain region forms a portion of a semiconductor fin, etching the first inter-level via exposes two opposite sidewalls of the source/drain region, depositing the first inter-level interconnect further comprises depositing a source/drain diffusion metallization on at least the two opposite source/drain sidewalls, and the method further comprises interconnecting the second transistor with a transistor in the first transistor level by etching a second inter-level via that exposes at least one sidewall of the gate electrode of the second transistor, extends through at least one of the one or more inter-level dielectric layers, and exposes a second conductive via land that is electrically coupled to a least one of a gate electrode or a semiconductor source/drain region of the transistor in the first transistor level, and then depositing a second inter-level interconnect in the second inter-level via with the second inter-level interconnect contacting both the gate electrode and the second via land.

In a further example of a fabrication method, etching the first inter-level via further comprises etching through a gate dielectric layer, and depositing the first inter-level interconnect further comprises depositing a gate electrode metallization onto a remaining portion of the gate dielectric.

In a further example of a fabrication method, etching the first inter-level via further comprises etching through a gate dielectric layer after etching through the one or more inter-level dielectric layers, and depositing the first inter-level interconnect further comprises depositing a gate electrode metallization onto a remaining portion of the gate dielectric.

In a further example of a fabrication method, etching the first inter-level via further comprises etching through a gate dielectric layer before etching through the one or more inter-level dielectric layers, and depositing the first inter-level interconnect further comprises depositing a gate electrode metallization onto a remaining portion of the gate dielectric.

In a further example of a fabrication method, etching the first inter-level via further comprises etching through a gate dielectric layer after forming a protective mask over a portion of the gate dielectric layer disposed on a top surface of a semiconductor body, and depositing the first inter-level interconnect further comprises depositing a gate electrode metallization onto a remaining portion of the gate dielectric.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A vertically integrated microelectronic device comprising:
    a first transistor including a first semiconductor body extending laterally within a first transistor level;
    a second transistor including:
    a second semiconductor body extending laterally within a second transistor level over the first transistor level and separated from the first transistor level by one or more inter-level dielectric layers; and
    a gate electrode disposed over a channel region between a source region and a drain region of the second semiconductor body, wherein the gate electrode is separated from the channel region by a gate dielectric layer; and an inter-level interconnect making ohmic contact with at least a sidewall of the gate electrode, making direct physical contact with the gate dielectric layer, extending below the gate dielectric layer and through at least one of the one or more inter-level dielectric layers, and electrically coupling with a terminal of the first transistor.

2. The device of claim 1, wherein:
    the second semiconductor body comprises a fin; and further comprising
    a second inter-level interconnect contacting at least one sidewall of a source or drain region of the fin.

3. The device of claim 2, wherein:
    the second inter-level interconnect is contacting at least two opposing sidewalls of the source or drain region of the fin, and electrically couples with a source or drain terminal of the first semiconductor body.

4. The device of claim 3, wherein:
    the second inter-level interconnect electrically couples with the source or drain terminal through an intervening interconnect metallization located between the first and second transistor levels; and the inter-level interconnect electrically interconnects with a transistor in the first transistor level through another intervening interconnect metallization located between the first second transistor levels.

5. The device of claim 1, wherein
    the inter-level interconnect electrically couples with the terminal through a first intervening interconnect metallization located between the first and second transistor levels.

6. The device of claim 1, wherein
    the inter-level interconnect is contacting at least one sidewall of the gate electrode.

7. The device of claim 1, wherein the inter-level interconnect is separated from a sidewall of a channel region of the second semiconductor body by only the gate dielectric, with the inter-level interconnect operable as a gate electrode of the second transistor.

8. The device of claim 1, wherein the gate dielectric is further disposed between the inter-level interconnect and at least one of the one or more inter-level dielectric layers.

9. The device of claim 1, wherein the inter-level interconnect is in direct contact with at least one of the one or more inter-level dielectric layers.

10. A monolithic three dimensional (3D) SRAM cell, comprising:
    two load transistors disposed on a first transistor level;
    two drive transistors and two pass-gate transistors disposed on a second transistor level over the first transistor level, with an inter-level dielectric layer disposed there between;
    a first inter-level interconnect contacting at least two opposing sidewalls of a semiconductor drain region of a first of the drive transistors and extending through the inter-level dielectric layer;
    a second inter-level interconnect contacting at least two opposing sidewalls of a semiconductor drain region of a second of the drive transistors and extending through the inter-level dielectric layer;
    a third inter-level interconnect in direct physical contact with a gate dielectric of the first of the drive transistors and extending through the inter-level dielectric layer;
    a fourth inter-level interconnect in direct physical contact with a gate dielectric of the second of the drive transistors and extending through the inter-level dielectric layer; wherein:
    the first inter-level interconnect electrically couples to a drain terminal of the first of the two load transistors;
    the second inter-level interconnect electrically couples to a drain terminal of the second of the two load transistors;
    the third inter-level interconnect electrically couples to a gate electrode of the first of the two load transistors; and
    the fourth inter-level interconnect electrically couples a gate electrode of the second of the two load transistors.

11. The 3D SRAM cell of claim 10, wherein:
    the load and drive transistors comprise laterally-oriented fins having semiconductor channel regions adjacent to the semiconductor drain regions; and
    the inter-level interconnects extend vertically through the inter-level dielectric layer, substantially orthogonal to the laterally-oriented fins.

12. The 3D SRAM cell of claim 10, wherein:
    each of the first and second inter-level interconnects contacts a separate intervening interconnect metallization located between the first the second transistor levels; and each of the third and fourth inter-level interconnects is disposed along at least one sidewall of the gate electrode or at least one sidewall of a semiconductor channel region of one of the drive transistors, and contacts a separate intervening interconnect metallization located between the first and the second transistor levels.

13. A microprocessor comprising:
an SRAM cache memory, wherein the SRAM cache memory further comprises the 3D SRAM cell of claim 10.

14. A mobile computing platform comprising:
the microprocessor of claim 13;
a display screen communicatively coupled to the microprocessor; and
a wireless transceiver communicatively coupled to the microprocessor.

15. A method of fabricating a vertically integrated microelectronic device, the method comprising:
receiving a first transistor within a first transistor level;
forming a second transistor over the first transistor with one or more inter-level dielectric layers there between; and
interconnecting the first and second transistors by:
etching an inter-level via that:
intersects a gate dielectric layer that extends over a semiconductor channel region of the second transistor;
extends through at least one of the one or more inter-level dielectric layers; and
exposes a conductive via land that is electrically coupled to the first transistor; and
depositing an inter-level interconnect in the inter-level via, wherein metal of the inter-level interconnect contacts both the via land and the gate dielectric layer.

16. The method of claim 15, wherein:
the semiconductor channel region is a portion of a semiconductor fin;
etching the inter-level via exposes at least one fin sidewall or a portion of the gate dielectric layer covering at least one fin sidewall;
depositing the inter-level interconnect further comprises depositing gate electrode metallization over the gate dielectric layer on at least the fin sidewall; and
the via land is a portion of an interconnect metallization contacting at least one of a gate electrode or a semiconductor source or drain region of the first transistor.

17. The method of claim 15, wherein:
the semiconductor channel region is a portion of a semiconductor fin;
etching the inter-level via exposes a top and two opposing fin sidewalls and further exposes a portion of an intra-level interconnect metallization contacting a semiconductor channel region of the first transistor; and
depositing the inter-level interconnect further comprises depositing a gate electrode metallization onto the fin top, on the two fin sidewalls, and on the exposed portion of the intra-level interconnect metallization.

18. The method of claim 15, wherein:
etching the inter-level via exposes a gate electrode top and a gate electrode sidewall and a sidewall of the gate dielectric layer located between the gate electrode and the one or more inter-level dielectric layers;

depositing the inter-level interconnect further comprises depositing a gate contact metallization onto the gate electrode top, gate electrode sidewall, and gate dielectric layer sidewall; and
the via land is a portion of an interconnect metallization contacting at least one of a gate electrode or a semiconductor source or drain region of the first transistor.

19. The method of claim 15, further comprising:
forming a second-level via landing on a top surface of the inter-level interconnect to electrically connect to both the first transistor and to the gate electrode of the second transistor.

20. The method of claim 15, wherein:
the semiconductor channel region is a portion of a semiconductor fin;
etching the inter-level via exposes two opposite sidewalls of the channel region, or a portion of the gate dielectric layer covering the channel region sidewalls;
depositing the first inter-level interconnect further comprises depositing a gate electrode metallization on at least the gate dielectric layer; and
wherein the method further comprises interconnecting the second transistor with a transistor in the first transistor level by etching a second inter-level via that:
exposes at least one sidewall of a semiconductor source or drain region of the second transistor;
extends through at least one of the one or more inter-level dielectric layers; and
exposes a second conductive via land that is electrically coupled to a least one of a gate electrode or a semiconductor source/drain region of a transistor in the first transistor level; and
depositing a second inter-level interconnect in the second inter-level via, the second inter-level interconnect contacting both the semiconductor source or drain region and the second via land.

21. The method of claim 15, wherein:
etching the inter-level via comprises etching through a portion of the gate dielectric layer intersecting a diameter of the via; and
depositing the inter-level interconnect further comprises depositing gate electrode metallization onto a remaining portion of the gate dielectric layer located on a sidewall of the inter-level via.

22. The method of claim 15, wherein:
etching the inter-level via comprises etching through portion of the gate dielectric layer located on a bottom of the via after etching the via through the one or more inter-level dielectric layers; and
depositing the inter-level interconnect further comprises depositing a gate electrode metallization onto a remaining portion of the gate dielectric layer located on a sidewall of the inter-level via.

23. The method of claim 15, wherein:
etching the inter-level via comprises etching through the gate dielectric layer before etching through the one or more inter-level dielectric layers; and
depositing the inter-level interconnect further comprises depositing a gate electrode metallization onto a remaining portion of the gate dielectric located on a sidewall of the inter-level via.

24. The method of claim 15, wherein:
etching the inter-level via comprises etching through the gate dielectric layer after forming a protective mask over a portion of the gate dielectric layer disposed on a top surface of the semiconductor channel region; and depositing the inter-level interconnect further comprises depositing a gate electrode metallization onto a remaining portion of the gate dielectric.

* * * * *